(12) United States Patent
Yan et al.

(10) Patent No.: US 11,830,398 B2
(45) Date of Patent: Nov. 28, 2023

(54) SHIFT REGISTER CIRCUIT, GATE DRIVING CIRCUIT AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Yan Yan, Beijing (CN); Yu Ma, Beijing (CN); Weitao Chen, Beijing (CN); Xiaopeng Cui, Beijing (CN)

(73) Assignees: Beijing Boe Display Technology Co., LTD., Beijing (CN); Boe Technology Group Co., LTD., Beijing (CN)

( * ) Notice: Subject to any disclaimer, the term of this patent is extended or adjusted under 35 U.S.C. 154(b) by 208 days.

(21) Appl. No.: 17/434,987

(22) PCT Filed: Dec. 28, 2020

(86) PCT No.: PCT/CN2020/140387
§ 371 (c)(1),
(2) Date: Aug. 30, 2021

(87) PCT Pub. No.: WO2021/169555
PCT Pub. Date: Sep. 2, 2021

(65) Prior Publication Data
US 2022/0327975 A1    Oct. 13, 2022

(30) Foreign Application Priority Data
Feb. 24, 2020  (CN) .......................... 202020201957.3

(51) Int. Cl.
G09G 3/20    (2006.01)
G11C 19/28   (2006.01)

(52) U.S. Cl.
CPC ............... *G09G 3/20* (2013.01); *G11C 19/28* (2013.01); *G09G 2300/0408* (2013.01);
(Continued)

(58) Field of Classification Search
CPC .. G11C 19/28; G09G 2310/0286; G09G 3/20; G09G 3/2092; G09G 3/2096
See application file for complete search history.

(56) References Cited

U.S. PATENT DOCUMENTS

2011/0150169 A1   6/2011  Lin et al.
2017/0193938 A1   7/2017  Feng et al.
(Continued)

FOREIGN PATENT DOCUMENTS

CN    105427799 A    3/2016
CN    107403602 A    11/2017
(Continued)

*Primary Examiner* — Xuemei Zheng
(74) *Attorney, Agent, or Firm* — IP & T GROUP LLP

(57) ABSTRACT

A shift register circuit includes a first pull-down control sub-circuit and a first noise reduction sub-circuit. The first pull-down control sub-circuit includes a first transistor and a second transistor, and a ratio of a width-to-length ratio of a channel of the second transistor to a width-to-length ratio of a channel of the first transistor is greater than 5:1. The first pull-down control sub-circuit transmits, in response to a first voltage signal received at a first voltage signal terminal, the first voltage signal to a first pull-down node through the first transistor, and transmits a second voltage signal received at a second voltage signal terminal to the first pull-down node through the second transistor under control of a voltage of a pull-up node. The first noise reduction sub-circuit transmits the second voltage signal to the pull-up node under control of a voltage of the first pull-down node.

20 Claims, 9 Drawing Sheets

(52) U.S. Cl.
CPC ............... *G09G 2300/0842* (2013.01); *G09G 2310/0267* (2013.01); *G09G 2310/0286* (2013.01)

(56) References Cited

U.S. PATENT DOCUMENTS

| | | |
|---|---|---|
| 2019/0096308 A1 | 3/2019 | Lv et al. |
| 2019/0287446 A1* | 9/2019 | Liao ..................... G11C 19/28 |
| 2020/0105357 A1 | 4/2020 | Xie et al. |
| 2020/0135287 A1* | 4/2020 | Han ..................... G09G 3/3677 |
| 2020/0184872 A1* | 6/2020 | Yuan .................... G09G 3/3677 |
| 2021/0335175 A1 | 10/2021 | Mi et al. |
| 2021/0335196 A1 | 10/2021 | Tao et al. |
| 2021/0366351 A1* | 11/2021 | Mi ........................ G11C 19/28 |

FOREIGN PATENT DOCUMENTS

| | | | | |
|---|---|---|---|---|
| CN | 107464521 | A | | 12/2017 |
| CN | 107527587 | A | | 12/2017 |
| CN | 108288451 | A | | 7/2018 |
| CN | 108389539 | A | | 8/2018 |
| CN | 109064964 | A * | 12/2018 | ............... G09G 3/20 |
| CN | 109147704 | A | | 1/2019 |
| CN | 109166600 | A | | 1/2019 |
| CN | 110246447 | A * | 9/2019 | |
| CN | 210865579 | U | | 6/2020 |
| WO | WO-2020253323 | A1 * | 12/2020 | |

\* cited by examiner

A2:A1=5:1       A2:A1=8:1

(a)       (b)

SHIFT REGISTER CIRCUIT, GATE DRIVING CIRCUIT AND DISPLAY APPARATUS

CROSS-REFERENCE TO RELATED APPLICATIONS

This application is a national phase entry under 35 USC 371 of International Patent Application No. PCT/CN2020/140387, filed on Dec. 28, 2020, which claims priority to Chinese Patent Application No. 202020201957.3, filed on Feb. 24, 2020, which are incorporated herein by reference in their entirety.

TECHNICAL FIELD

The present disclosure relates to the field of display technologies, and in particular, to a shift register circuit, a gate driving circuit and a display apparatus.

BACKGROUND

The gate driver on array (GOA) technology is a technology for integrating gate driving circuits on an array substrate.

SUMMARY

In an aspect, a shift register circuit is provided. The shift register circuit includes a first pull-down control sub-circuit and a first noise reduction sub-circuit. The first pull-down control sub-circuit includes a first transistor and a second transistor. The first transistor is coupled to a first voltage signal terminal and a first pull-down node, and the second transistor is coupled to a pull-up node, a second voltage signal terminal and the first pull-down node. A ratio of a width-to-length ratio of a channel of the second transistor to a width-to-length ratio of a channel of the first transistor is greater than 5:1; The first pull-down control sub-circuit is configured to: transmit, in response to a first voltage signal received at the first voltage signal terminal, the first voltage signal to the first pull-down node through the first transistor, and transmit a second voltage signal received at the second voltage signal terminal to the first pull-down node through the second transistor under control of a voltage of the pull-up node. The first noise reduction sub-circuit is coupled to the first pull-down node, the second voltage signal terminal and the pull-up node, and the first noise reduction sub-circuit is configured to transmit the second voltage signal to the pull-up node under control of a voltage of the first pull-down node.

In some embodiments, the ratio of the width-to-length ratio of the channel of the second transistor to the width-to-length ratio of the channel of the first transistor is greater than or equal to 8:1.

In some embodiments, the ratio of the width-to-length ratio of the channel of the second transistor to the width-to-length ratio of the channel of the first transistor is less than or equal to 10:1.

In some embodiments, a width of the channel of the first transistor is in a range of 50 μm to 200 μm, inclusive, and a length thereof is in a range of 3 μm to 5 μm, inclusive.

In some embodiments, a width of the channel of the second transistor is in a range of 400 μm to 1500 μm, inclusive, and a length thereof is in a range of 3 μm to 5 μm, inclusive.

In some embodiments, a control electrode of the first transistor is coupled to a first pull-down control node, a first electrode of the first transistor is coupled to the first voltage signal terminal, and a second electrode of the first transistor is coupled to the first pull-down node. A control electrode of the second transistor is coupled to the pull-up node, a first electrode of the second transistor is coupled to the second voltage signal terminal, and a second electrode of the second transistor is coupled to the first pull-down node.

The first pull-down control sub-circuit further includes a third transistor and a fourth transistor. A control electrode and a first electrode of the third transistor are coupled to the first voltage signal terminal, and a second electrode of the third transistor is coupled to the first pull-down control node. A control electrode of the fourth transistor is coupled to the pull-up node, a first electrode of the fourth transistor is coupled to the second voltage signal terminal, and a second electrode of the fourth transistor is coupled to the first pull-down control node.

In some embodiments, the first noise reduction sub-circuit includes a fifth transistor. A control electrode of the fifth transistor is coupled to the first pull-down node, a first electrode of the fifth transistor is coupled to the second voltage signal terminal, and a second electrode of the fifth transistor is coupled to the pull-up node.

In some embodiments, the shift register circuit further includes a first signal output sub-circuit, a signal input sub-circuit, a second noise reduction sub-circuit and a third noise reduction sub-circuit. The first signal output sub-circuit is coupled to the pull-up node, a clock signal terminal and a first signal output terminal. The first signal output sub-circuit is configured to transmit a clock signal received at the clock signal terminal to the first signal output terminal under the control of the voltage of the pull-up node. The signal input sub-circuit is coupled to the pull-up node and a signal input terminal. The signal input sub-circuit is configured to transmit, in response to an input signal received at the signal input terminal, the input signal to the pull-up node. The second noise reduction sub-circuit is coupled to the pull-up node, a reset signal terminal and the second voltage signal terminal. The second noise reduction sub-circuit is configured to transmit the second voltage signal received at the second voltage signal terminal to the pull-up node in response to a reset signal received at the reset signal terminal. The third noise reduction sub-circuit is coupled to the first pull-down node, a third voltage signal terminal and the first signal output terminal. The third noise reduction sub-circuit is configured to transmit a third voltage signal received at the third voltage signal terminal to the first signal output terminal under the control of the voltage of the first pull-down node.

In some embodiments, the first signal output sub-circuit includes a sixth transistor and a storage capacitor. A control electrode of the sixth transistor is coupled to the pull-up node, a first electrode of the sixth transistor is coupled to the clock signal terminal, and a second electrode of the sixth transistor is coupled to the first signal output terminal. A first electrode of the storage capacitor is coupled to the pull-up node, and a second electrode of the storage capacitor is coupled to the first signal output terminal. The signal input sub-circuit includes a seventh transistor. A control electrode and a first electrode of the seventh transistor are coupled to the signal input terminal, and a second electrode of the seventh transistor is coupled to the pull-up node. The second noise reduction sub-circuit includes an eighth transistor. A control electrode of the eighth transistor is coupled to the reset signal terminal, a first electrode of the eighth transistor is coupled to the second voltage signal terminal, and a second electrode of the eighth transistor is coupled to the pull-up node. The third noise reduction sub-circuit includes a ninth transistor. A control electrode of the ninth transistor is coupled to the first pull-down node, a first electrode of the ninth transistor is coupled to the third voltage signal terminal, and a second electrode of the ninth transistor is coupled to the first signal output terminal.

In some embodiments, the shift register circuit further includes a second signal output sub-circuit and a fourth noise reduction sub-circuit. The second signal output sub-circuit is coupled to the pull-up node, the clock signal terminal and a second signal output terminal. The second signal output sub-circuit is configured to transmit the clock signal received at the clock signal terminal to the second signal output terminal under the control of the voltage of the pull-up node. The fourth noise reduction sub-circuit is coupled to the first pull-down node, the second signal output terminal and the second voltage signal terminal. The fourth noise reduction sub-circuit is configured to transmit the second voltage signal received at the second voltage signal terminal to the second signal output terminal under the control of the voltage of the first pull-down node.

In some embodiments, the second signal output sub-circuit includes a tenth transistor. A control electrode of the tenth transistor is coupled to the pull-up node, a first electrode of the tenth transistor is coupled to the clock signal terminal, and a second electrode of the tenth transistor is coupled to the second signal output terminal. The fourth noise reduction sub-circuit includes an eleventh transistor. A control electrode of the eleventh transistor is coupled to the first pull-down node, a first electrode of the eleventh transistor is coupled to the second voltage signal terminal, and a second electrode of the eleventh transistor is coupled to the second signal output terminal.

In some embodiments, the shift register circuit further includes a second pull-down control sub-circuit and a fifth noise reduction sub-circuit. The second pull-down control sub-circuit includes a twelfth transistor and a thirteenth transistor. The twelfth transistor is coupled to a fourth voltage signal terminal and a second pull-down node, and the thirteenth transistor is coupled to the pull-up node, the second voltage signal terminal and the second pull-down node. A width-to-length ratio of a channel of the twelfth transistor is equal to the width-to-length ratio of the channel of the first transistor, and a width-to-length ratio of a channel of the thirteenth transistor is equal to the width-to-length ratio of the channel of the second transistor. The second pull-down control sub-circuit is configured to: transmit, in response to a fourth voltage signal received at the fourth voltage signal terminal, the fourth voltage signal to the second pull-down node through the twelfth transistor, and transmit the second voltage signal received at the second voltage signal terminal to the second pull-down node through the thirteenth transistor under the control of the voltage of the pull-up node.

The fifth noise reduction sub-circuit is coupled to the second pull-down node, the pull-up node and the second voltage signal terminal, and the fifth noise reduction sub-circuit is configured to transmit the second voltage signal to the pull-up node under control of a voltage of the second pull-down node.

In some embodiments, a control electrode of the twelfth transistor is coupled to a second pull-down control node. A first electrode of the twelfth transistor is coupled to the fourth voltage signal terminal, and a second electrode of the twelfth transistor is coupled to the second pull-down node. A control electrode of the thirteenth transistor is coupled to the pull-up node, a first electrode of the thirteenth transistor is coupled to the second voltage signal terminal, and a second electrode of the thirteenth transistor is coupled to the second pull-down node.

The second pull-down control sub-circuit further includes a fourteenth transistor and a fifteenth transistor. A control electrode and a first electrode of the fourteenth transistor are coupled to the fourth voltage signal terminal, and a second electrode of the fourteenth transistor is coupled to the second pull-down control node. A control electrode of the fifteenth transistor is coupled to the pull-up node, a first electrode of the fifteenth transistor is coupled to the second voltage signal terminal, and a second electrode of the fifteenth transistor is coupled to the second pull-down control node.

In some embodiments, the fifth noise reduction sub-circuit includes a sixteenth transistor. A control electrode of the sixteenth transistor is coupled to the second pull-down node, a first electrode of the sixteenth transistor is coupled to the second voltage terminal, and a second electrode of the sixteenth transistor is coupled to the pull-up node.

In some embodiments, in a case where the shift register circuit includes a first signal output sub-circuit, the shift register circuit further includes a sixth noise reduction sub-circuit. The sixth noise reduction sub-circuit is coupled to the second pull-down node, a third voltage signal terminal and a first signal output terminal. The sixth noise reduction sub-circuit is configured to transmit a third voltage signal received at the third voltage signal terminal to the first signal output terminal under the control of the voltage of the second pull-down node.

In a case where the shift register circuit includes a second signal output sub-circuit, the shift register circuit further includes a seventh noise reduction sub-circuit. The seventh noise reduction sub-circuit is coupled to the second pull-down node, the second voltage signal terminal and a second signal output terminal. The seventh noise reduction sub-circuit is configured to transmit the second voltage signal received at the second voltage signal terminal to the second signal output terminal under the control of the voltage of the second pull-down node.

In some embodiments, the sixth noise reduction sub-circuit includes a seventeenth transistor. A control electrode of the seventeenth transistor is coupled to the second pull-down node, a first electrode of the seventeenth transistor is coupled to the third voltage signal terminal, and a second electrode of the seventeenth transistor is coupled to the first signal output terminal. The seventh noise reduction sub-circuit includes an eighteenth transistor. A control electrode of the eighteenth transistor is coupled to the second pull-down node, a first electrode of the eighteenth transistor is coupled to the second voltage signal terminal, and a second electrode of the eighteenth transistor is coupled to the second signal output terminal.

In some embodiments, the shift register circuit further includes an eighth noise reduction sub-circuit. The eighth noise reduction sub-circuit is coupled to an initial signal terminal, the pull-up node and the second voltage signal terminal. The eighth noise reduction sub-circuit is configured to transmit the second voltage signal received at the second voltage signal terminal to the pull-up node in response to an initial signal received at the initial signal terminal.

In some embodiments, the eighth noise reduction sub-circuit includes a nineteenth transistor. A control electrode of the nineteenth transistor is coupled to the initial signal terminal, a first electrode of the nineteenth transistor is coupled to the second voltage signal terminal, and a second electrode of the nineteenth transistor is coupled to the pull-up node.

In another aspect, a gate driving circuit is provided. The gate driving circuit includes a plurality of shift register circuits connected in cascade each as described in any of the above embodiments. A first signal output terminal of each shift register circuit is coupled to a gate line. A second signal output terminal of each shift register circuit other than a first-stage shift register circuit is coupled to a signal input terminal of a next-stage shift register circuit thereof; and the second signal output terminal of each shift register circuit other than a last-stage shift register circuit is coupled to a reset signal terminal of a previous-stage shift register circuit thereof.

In yet another aspect, a display apparatus is provided. The display apparatus includes the gate driving circuit as described in any of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
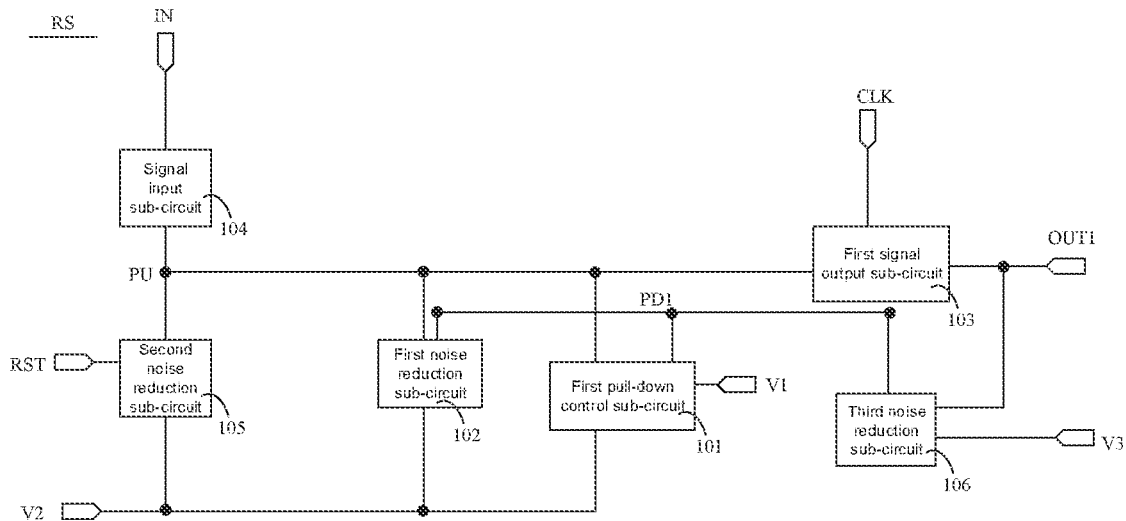
FIG. 1 is a structural diagram of a shift register circuit, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined by "first" or "second" may explicitly or implicitly include one or more of the features. In the description of the embodiments of the present disclosure, the term "a plurality of" or "the plurality of" means two or more unless otherwise specified.

In the description of some embodiments, the terms such as "coupled" and "connected" and their derivatives may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

In the related art, transistors of a shift register circuit have a certain proportional relationship, and a signal input terminal of the shift register circuit receives an input signal, so that the shift register circuit starts to operate and output normally. If a voltage of the input signal received at the signal input terminal exceeds a certain range, or process fluctuation occurs in a process of producing the shift register circuit to affect structures of the transistors and result in a large leakage current of the transistors, a normal output of the shift register circuit may be affected, which leads to a decrease in a display effect of a display apparatus and poorness of horizontal black lines.

Some embodiments of the present disclosure provide a shift register circuit RS, and as shown in FIG. 1, the shift register circuit RS includes a first pull-down control sub-circuit 101 and a first noise reduction sub-circuit 102.

Figure 2:
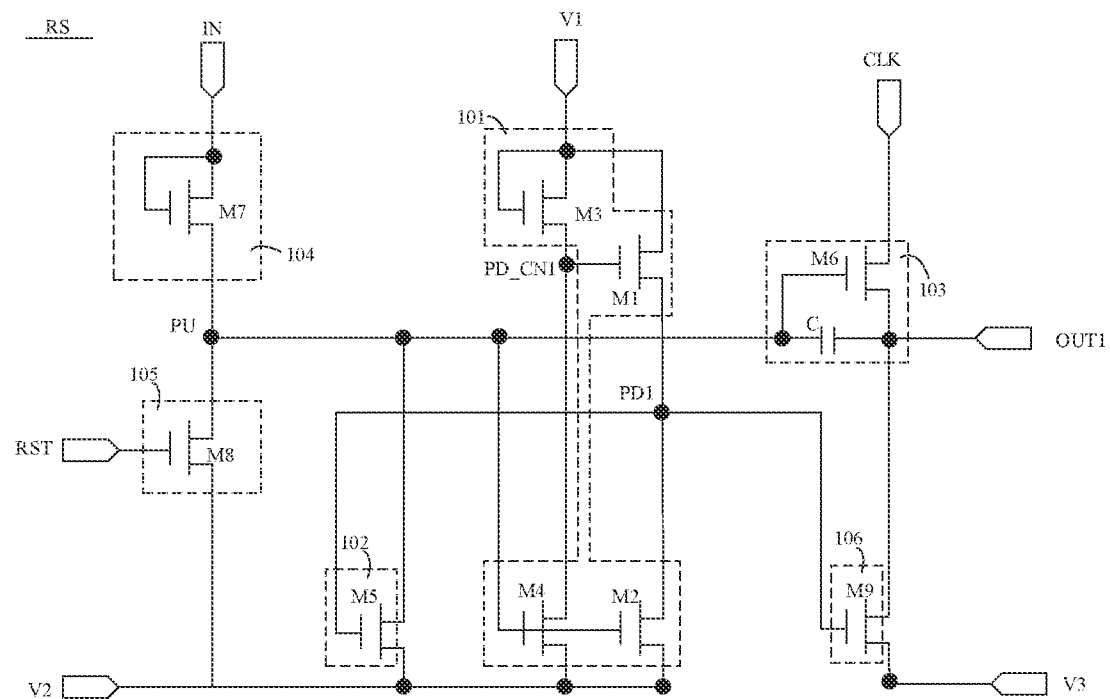
FIG. 2 is a structural diagram of another shift register circuit, in accordance with some embodiments.

As shown in FIG. 2, the first pull-down control sub-circuit 101 includes a first transistor M1 and a second transistor M2. The first transistor M1 is coupled to a first voltage signal terminal V1 and a first pull-down node PD1. The second transistor M2 is coupled to a pull-up node PU, a second voltage signal terminal V2 and the first pull-down node PD1.

A ratio of a width-to-length ratio of a channel of the second transistor M2 to a width-to-length ratio of a channel of the first transistor M1 is greater than 5:1.

As shown in FIG. 1, the first noise reduction sub-circuit 102 is coupled to the first pull-down node PD1, the second voltage signal terminal V2 and the pull-up node PU.

The first pull-down control sub-circuit 101 is configured to transmit, in response to a first voltage signal received at the first voltage signal terminal V1, the first voltage signal to the first pull-down node PD1 through the first transistor M1, and transmit a second voltage signal received at the second voltage signal terminal V2 to the first pull-down node PD1 through the second transistor M2 under control of a voltage of the pull-up node PU.

The first noise reduction sub-circuit 102 is configured to transmit the second voltage signal to the pull-up node PU under control of a voltage of the first pull-down node PD1.

In some embodiments, the first voltage signal terminal V1 is configured to transmit a direct-current (DC) high-level signal (e.g., higher than or equal to a high-level portion of a clock signal) during an operation period of the first pull-down control sub-circuit 101, and the DC high-level signal is referred to herein as the first voltage signal.

The second voltage signal terminal V2 is configured to transmit a DC low-level signal (e.g., lower than or equal to a low-level portion of the clock signal), and the DC low-level signal is referred to herein as the second voltage signal. For example, an amplitude range of a voltage of the second voltage signal is less than or equal to −8V.

It will be noted that, in embodiments of the present disclosure, a transistor includes an active layer, a source electrode and a drain electrode. Under an action of an applied voltage, a conductive channel may be formed in the active layer between the source electrode and the drain electrode of the transistor, and the conductive channel is referred to as a channel. In the embodiments of the present disclosure, a length of the channel of the transistor refers to a distance L between the source electrode and the drain electrode, and a width of the channel of the transistor refers to a width W of the source electrode and the drain electrode in a direction perpendicular to a connection line between the source electrode and the drain electrode. Therefore, a width-to-length ratio of the channel of the transistor refers to a ratio of W to L.

In the embodiments of the present disclosure, since the ratio of the width-to-length ratio of the channel of the second transistor M2 to the width-to-length ratio of the channel of the first transistor M1 is greater than 5:1, a driving capability of the second transistor M2 is greater than a driving capability of the first transistor M1. Therefore, in a case where the pull-up node PU is charged, the second voltage signal received at the second voltage signal terminal V2 is transmitted to the first pull-down node PD1 through the second transistor M2, so that a potential of the first pull-down node PD1 may be maintained at a low-level potential. In this case, the first noise reduction sub-circuit 102 is not turned on, and the second voltage signal is not transmitted to the pull-up node PU, which prevents leakage of the first noise reduction sub-circuit 102 from affecting a potential of the pull-up node PU, so that the pull-up node PU may be maintained at a high potential to ensure normal output of the shift register circuit RS.

Figure 3:
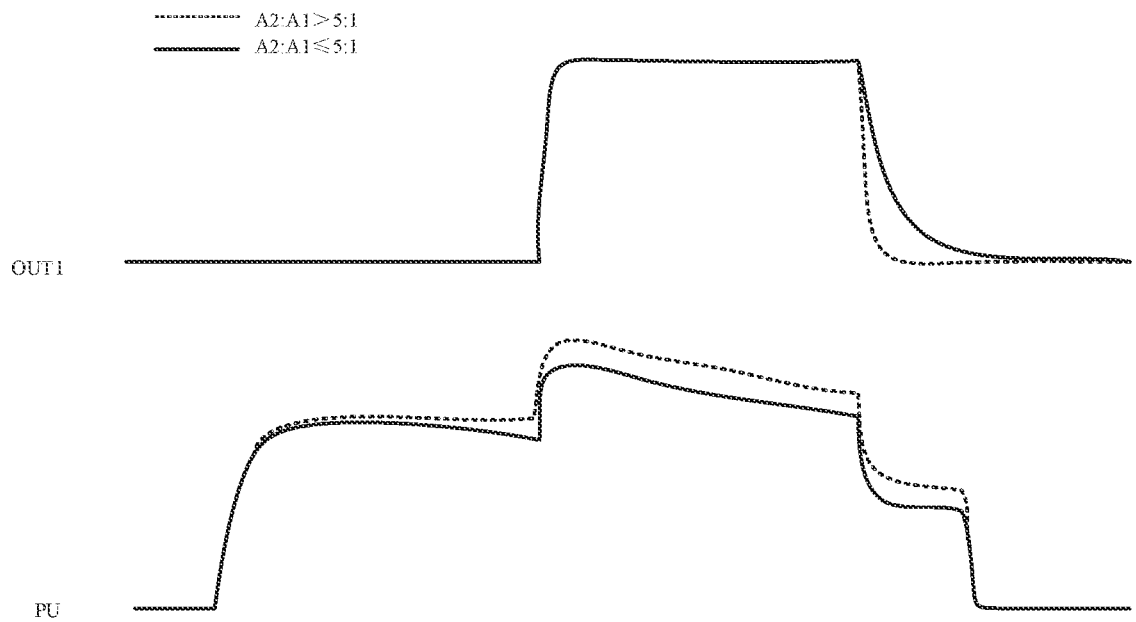
FIG. 3 is a waveform diagram of a signal at a pull-up node and a first signal output terminal in a shift register circuit, in accordance with some embodiments.

For example, as shown in FIG. 3, compared to a case where the ratio of the width-to-length ratio (A2) of the channel of the second transistor M2 to the width-to-length ratio (A1) of the channel of the first transistor M1 is less than or equal to 5:1, in a case where the ratio of the width-to-length ratio (A2) of the channel of the second transistor M2 to the width-to-length ratio (A1) of the channel of the first transistor M1 is greater than 5:1, the potential of the pull-up node PU may maintain a high potential, so that a falling-edge time of a first signal output terminal OUT1 of the shift register circuit RS may be shortened, thereby avoiding poor display due to prolongation of the falling-edge time of the first signal output terminal OUT1 of the shift register circuit RS.

Therefore, the shift register circuit RS provided by the embodiments of the present disclosure includes the first pull-down control sub-circuit 101 and the first noise reduction sub-circuit 102, the first pull-down control sub-circuit 101 includes the first transistor M1 and the second transistor M2, and the ratio of the width-to-length ratio of the channel of the second transistor M2 to the width-to-length ratio of the channel of the first transistor M1 is greater than 5:1. In a case where the pull-up node PU is charged, the second voltage signal received at the second voltage signal terminal V2 is transmitted to the first pull-down node PD1 through the second transistor M2, so that the potential of the first pull-down node PD1 may be maintained at a low-level potential. In this case, the first noise reduction sub-circuit 102 is not turned on, and the second voltage signal is not transmitted to the pull-up node PU, which prevents leakage of the first noise reduction sub-circuit 102 from affecting the potential of the pull-up node PU, so that the pull-up node PU may be maintained at a high potential to ensure the normal output of the shift register circuit RS and avoid poor display.

In some embodiments, the ratio of the width-to-length ratio of the channel of the second transistor M2 to the width-to-length ratio of the channel of the first transistor M1 is greater than or equal to 8:1. In this case, the driving capability of the second transistor M2 may be further improved compared to the driving capability of the first transistor M1, so that the potential of the pull-up node PU may be maintained at a high level to ensure the normal output of the shift register circuit RS during an effective output process of the shift register circuit RS.

In some embodiments, the ratio of the width-to-length ratio of the channel of the second transistor M2 to the width-to-length ratio of the channel of the first transistor M1 is less than or equal to 10:1. In this case, difference between the driving capability of the first transistor M1 and the driving capability of the second transistor M2 is not too large. By transmitting the first voltage signal to the first pull-down node PD1 through the first transistor M1, the first pull-down node PD1 may be effectively charged, thereby improving a noise reduction effect on the shift register circuit RS and avoiding a long-term reliability risk.

In some embodiments, a width of the channel of the first transistor M1 is in a range of 50 μm to 200 μm, inclusive, and a length thereof is in a range of 3 μm to 5 μm, inclusive. For example, the width of the channel of the first transistor M1 may be 62.5 μm, 100 μm or 125 μm. For example, the length of the channel of the first transistor M1 may be 3.5 μm, 4 μm or 5 μm.

In some embodiments, a width of the channel of the second transistor M2 is in a range of 400 μm to 1500 μm, inclusive, and a length thereof is in a range of 3 μm to 5 μm, inclusive. For example, the width of the channel of the second transistor M2 may be 500 μm, 625 μm or 800 μm. For example, the length of the channel of the second transistor M2 may be 3 μm, 4.5 μm or 5 μm.

It will be noted that, in a process of adjusting a proportional relationship among width-to-length ratios of channels of transistors in the shift register circuit RS, the width-to-length ratios of the channels of the transistors may be changed by changing widths of the channels of the transistors in a case where lengths of the channels of the transistors are kept unchanged; or the width-to-length ratios of the channels of the transistors may be changed by changing the lengths of the channels of the transistors in a case where the widths of the channels of the transistors are kept unchanged; or the width-to-length ratios of the channels of the transistors may be changed by changing both the lengths and the widths of the channels of the transistors, which is not limited herein.

Figure 4:
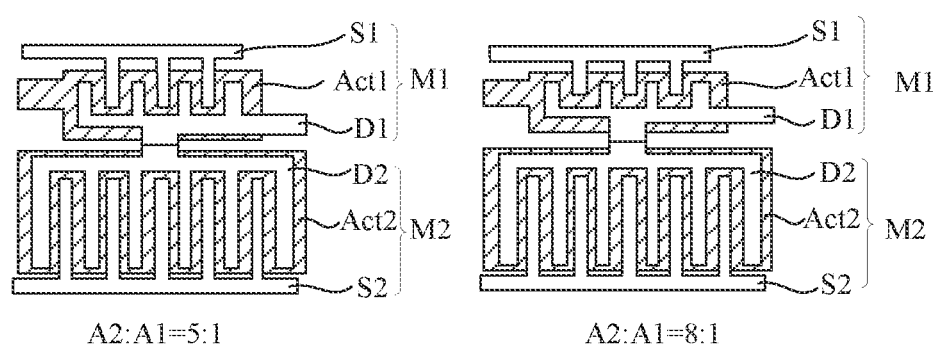
FIG. 4 is a comparative diagram of structures of a first transistor and a second transistor in a shift register circuit, in accordance with some embodiments.

For example, in some display products, the width-to-length ratios of the channels of the second transistors M2 are kept unchanged, the lengths of the channels of the first transistors M1 are kept unchanged, and the ratios of the width-to-length ratio of the channel of the second transistor M2 to the width-to-length ratio of the channel of the first transistor M1 may be changed by changing the widths of the channels of the first transistors M1. As shown in FIG. 4, the first transistors M1 each include a first active layer Act1, a first source electrode S1 and a first drain electrode D1, and the second transistors M2 each include a second active layer Act2, a second source electrode S2 and a second drain electrode D2. The lengths of the channels of the second transistors M2 in parts (a) and (b) of FIG. 4 are 5 μm and the widths thereof are 500 μm, the lengths of the channels of the first transistors M1 in parts (a) and (b) of FIG. 4 are 5 μm, and the widths thereof are reduced from 100 μm (in part (a) of FIG. 4) to 62.5 μm (in part (b) of FIG. 4). As a result, the ratios of the width-to-length ratio (A2) of the channel of the second transistor M2 to the width-to-length ratio (A1) of the channel of the first transistor M1 are increased from 5:1 to 8:1, and a defective rate of an actual tested product is reduced from 62.5% to 4.7%.

Figure 5:
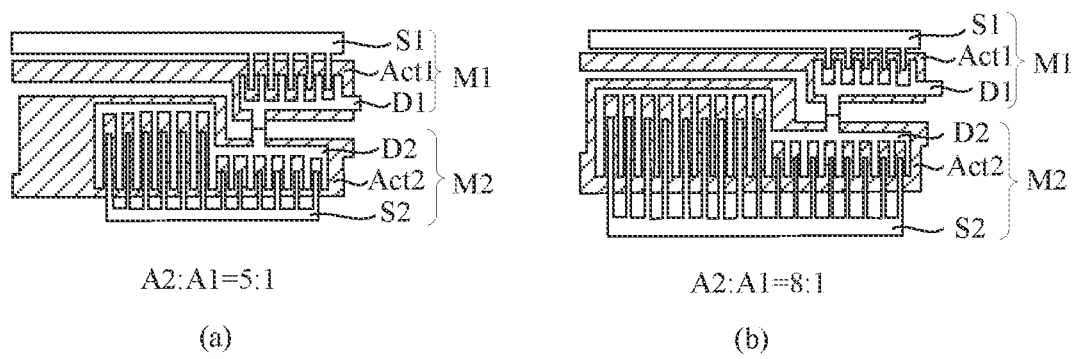
FIG. 5 is another comparative diagram of structures of a first transistor and a second transistor in a shift register circuit, in accordance with some embodiments.

For example, in some other display products, the lengths of the channels of the second transistors M2 and the lengths of the channels of the first transistors M1 are kept unchanged, and the ratios of the width-to-length ratio (A2) of the channel of the second transistor M2 to the width-to-length ratio (A1) of the channel of the first transistor M1 may be changed by changing the widths of the channels of the first transistors M1 and the widths of the channels of the second transistors M2. As shown in FIG. 5, the first transistors M1 each include the first active layer Act1, the first source electrode S1 and the first drain electrode D1, and the second transistors M2 each include the second active layer Act2, the second source electrode S2 and the second drain electrode D2. The lengths of the channels of the second transistors M2 in parts (a) and (b) of FIG. 5 are 5 μm and the widths thereof are increased from 625 μm (in part (a) of FIG. 5) to 800 μm (in part (b) of FIG. 5), and the lengths of the channels of the first transistors M1 are 5 μm and the widths thereof are reduced from 125 μm (in part (a) of FIG. 5) to 100 μm (in part (b) of FIG. 5). As a result, the ratios of the width-to-length ratio of the channel of the second transistor M2 (A2) to the width-to-length ratio of the channel of the first transistor M1 (A1) are increased from 5:1 to 8:1, and the defective rate of the actual tested product is reduced from 26.6% to 4.6%.

Therefore, the ratio of the width-to-length ratio of the channel of the second transistor M2 to the width-to-length ratio of the channel of the first transistor M1 is greater than 5:1, so that the defective rate of display products may be reduced and display problems such as horizontal black lines may be avoided.

In some embodiments, as shown in FIG. 2, a control electrode of the first transistor M1 is coupled to a first pull-down control node PD_CN1, a first electrode of the first transistor M1 is coupled to the first voltage signal terminal V1, and a second electrode of the first transistor M1 is coupled to the first pull-down node PD1.

A control electrode of the second transistor M2 is coupled to the pull-up node PU, a first electrode of the second transistor M2 is coupled to the second voltage signal terminal V2, and a second electrode of the second transistor M2 is coupled to the first pull-down node PD1.

In some embodiments, as shown in FIG. 2, the first pull-down control sub-circuit 101 further includes a third transistor M3 and a fourth transistor M4.

A control electrode and a first electrode of the third transistor M3 are coupled to the first voltage signal terminal V1, and a second electrode of the third transistor M3 is coupled to the first pull-down control node PD_CN1.

A control electrode of the fourth transistor M4 is coupled to the pull-up node PU, a first electrode of the fourth transistor M4 is coupled to the second voltage signal terminal V2, and a second electrode of the fourth transistor M4 is coupled to the first pull-down control node PD_CN1.

A width-to-length ratio of a channel of the fourth transistor M4 is greater than a width-to-length ratio of a channel of the third transistor M3. Therefore, a driving capability of the fourth transistor M4 is greater than a driving capability of the third transistor M3. In this case, when the fourth transistor M4 and the third transistor M3 are turned on, the fourth transistor M4 transmits the second voltage signal to the first pull-down control node PD_CN1, so that a potential of the first pull-down control node PD_CN1 may be maintained at a potential of the second voltage signal.

In some embodiments, as shown in FIG. 2, the first noise reduction sub-circuit 102 includes a fifth transistor M5.

A control electrode of the fifth transistor M5 is coupled to the first pull-down node PD1, a first electrode of the fifth transistor M5 is coupled to the second voltage signal terminal V2, and a second electrode of the fifth transistor M5 is coupled to the pull-up node PU.

In some embodiments, as shown in FIG. 1, the shift register circuit RS further includes a first signal output sub-circuit 103, a signal input sub-circuit 104, a second noise reduction sub-circuit 105 and a third noise reduction sub-circuit 106.

The first signal output sub-circuit 103 is coupled to the pull-up node PU, a clock signal terminal CLK and the first signal output terminal OUT1.

The signal input sub-circuit 104 is coupled to the pull-up node PU and a signal input terminal IN.

The second noise reduction sub-circuit 105 is coupled to the pull-up node PU, a reset signal terminal RST and the second voltage signal terminal V2.

The third noise reduction sub-circuit 106 is coupled to the first pull-down node PD1, a third voltage signal terminal V3 and the first signal output terminal OUT1.

On this basis, the first signal output sub-circuit 103 is configured to transmit a clock signal received at the clock signal terminal CLK to the first signal output terminal OUT1 under the control of the voltage of the pull-up node PU.

The signal input sub-circuit 104 is configured to transmit, in response to an input signal received at the signal input terminal IN, the input signal to the pull-up node PU.

The second noise reduction sub-circuit 105 is configured to transmit the second voltage signal received at the second voltage signal terminal V2 to the pull-up node PU in response to a reset signal received at the reset signal terminal RST.

The third noise reduction sub-circuit 106 is configured to transmit a third voltage signal received at the third voltage signal terminal V3 to the first signal output terminal OUT1 under the control of the voltage of the first pull-down node PD1.

It will be noted that, the third voltage signal terminal V3 is configured to transmit a DC low-level signal (e.g., lower than or equal to the low-level portion of the clock signal), and the DC low-level signal is referred to herein as the third voltage signal.

The potential of the second voltage signal may be lower than a potential of the third voltage signal, or the potential of the second voltage signal is equal to the potential of the third voltage signal.

For example, as shown in FIG. 2, the first signal output sub-circuit 103 includes a sixth transistor M6 and a storage capacitor C.

A control electrode of the sixth transistor M6 is coupled to the pull-up node PU, a first electrode of the sixth transistor M6 is coupled to the clock signal terminal CLK, and a second electrode of the sixth transistor M6 is coupled to the first signal output terminal OUT1.

A first electrode of the storage capacitor C is coupled to the pull-up node PU, and a second electrode of the storage capacitor C is coupled to the first signal output terminal OUT1.

For example, as shown in FIG. 2, the signal input sub-circuit 104 includes a seventh transistor M7.

A control electrode and a first electrode of the seventh transistor M7 are coupled to the signal input terminal IN, and a second electrode of the seventh transistor M7 is coupled to the pull-up node PU.

For example, as shown in FIG. 2, the second noise reduction sub-circuit 105 includes an eighth transistor M8.

A control electrode of the eighth transistor M8 is coupled to the reset signal terminal RST, a first electrode of the eighth transistor M8 is coupled to the second voltage signal terminal V2, and a second electrode of the eighth transistor M8 is coupled to the pull-up node PU.

For example, as shown in FIG. 2, the third noise reduction sub-circuit 106 includes a ninth transistor M9.

A control electrode of the ninth transistor M9 is coupled to the first pull-down node PD1, a first electrode of the ninth transistor M9 is coupled to the third voltage signal terminal V3, and a second electrode of the ninth transistor M9 is coupled to the first signal output terminal OUT1.

Figure 6:
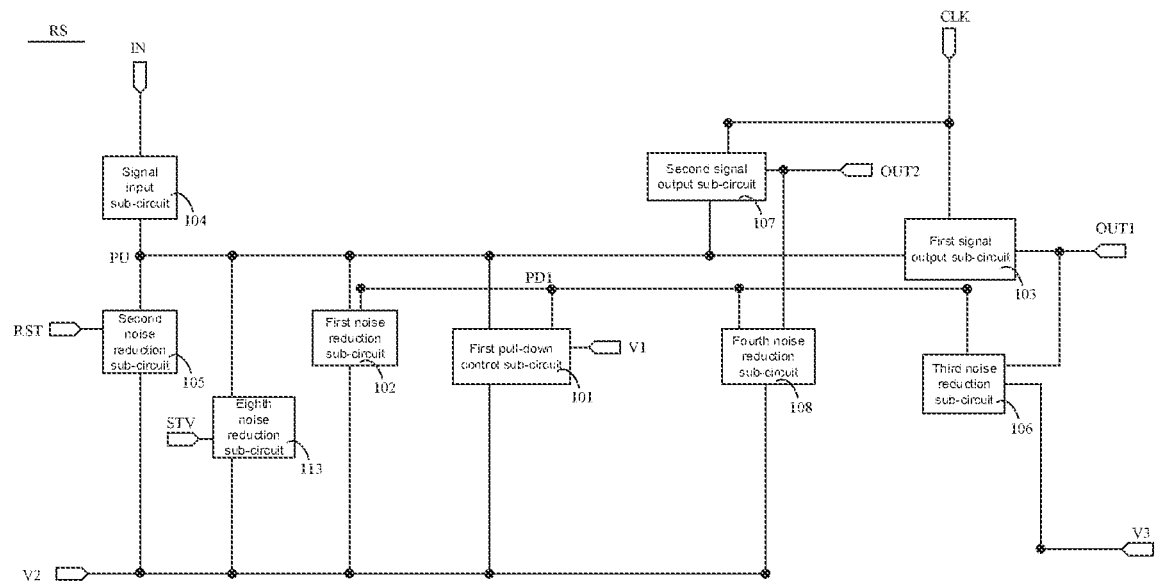
FIG. 6 is a structural diagram of yet another shift register circuit, in accordance with some embodiments.

In some embodiments, as shown in FIG. 6, the shift register circuit RS further includes a second signal output sub-circuit 107 and a fourth noise reduction sub-circuit 108.

The second signal output sub-circuit 107 is coupled to the pull-up node PU, the clock signal terminal CLK and a second signal output terminal OUT2.

The fourth noise reduction sub-circuit 108 is coupled to the first pull-down node PD1, the second signal output terminal OUT2 and the second voltage signal terminal V2.

The second signal output sub-circuit 107 is configured to transmit the clock signal received at the clock signal terminal CLK to the second signal output terminal OUT2 under the control of the voltage of the pull-up node PU.

The fourth noise reduction sub-circuit 108 is configured to transmit the second voltage signal received at the second voltage signal terminal V2 to the second signal output terminal OUT2 under the control of the voltage of the first pull-down node PD1.

It will be noted that, in a case where the shift register circuit RS includes the first signal output sub-circuit 103 and the second signal output sub-circuit 107, the first signal output sub-circuit 103 transmits the clock signal to the first signal output terminal OUT1 to serve as a gate driving signal, and the second signal output sub-circuit 107 transmits the clock signal to the second signal output terminal OUT2 to serve as a cascade driving signal.

Figure 7:
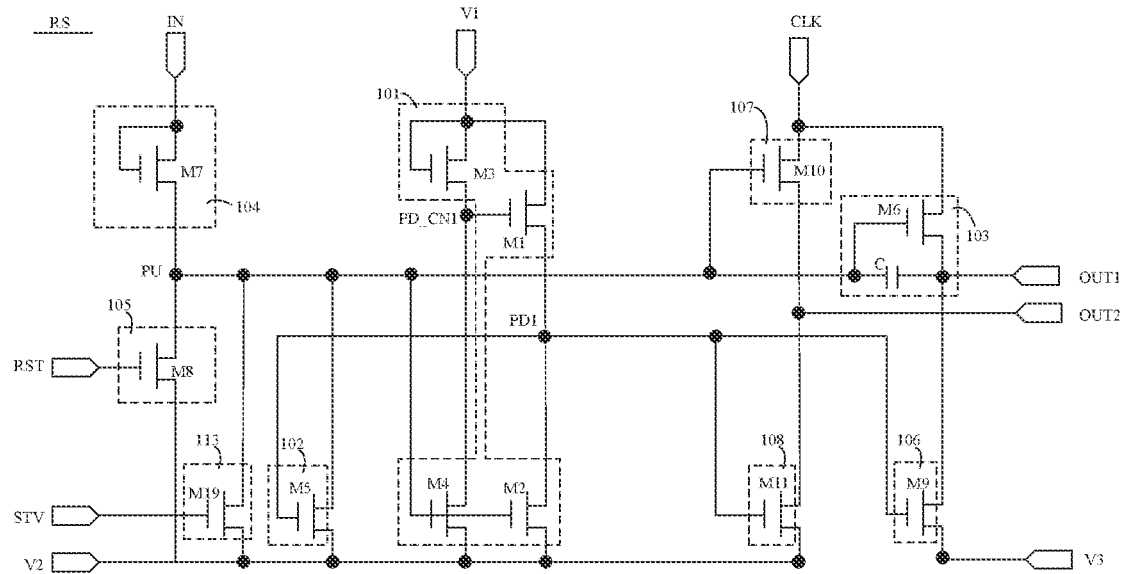
FIG. 7 is a structural diagram of yet another shift register circuit, in accordance with some embodiments.

For example, as shown in FIG. 7, the second signal output sub-circuit 107 includes a tenth transistor M10.

A control electrode of the tenth transistor M10 is coupled to the pull-up node PU, a first electrode of the tenth transistor M10 is coupled to the clock signal terminal CLK, and a second electrode of the tenth transistor M10 is coupled to the second signal output terminal OUT2.

For example, as shown in FIG. 7, the fourth noise reduction sub-circuit 108 includes an eleventh transistor M11.

A control electrode of the eleventh transistor M11 is coupled to the first pull-down node PD1, a first electrode of the eleventh transistor M11 is coupled to the second voltage signal terminal V2, and a second electrode of the eleventh transistor M11 is coupled to the second signal output terminal OUT2.

Figure 8:
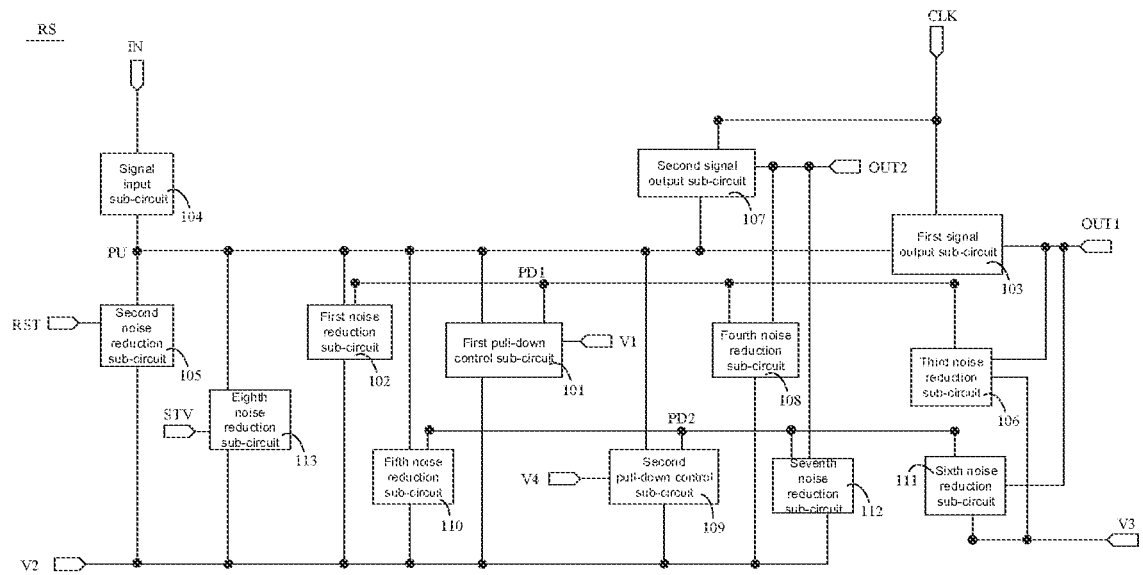
FIG. 8 is a structural diagram of yet another shift register circuit, in accordance with some embodiments.
Figure 9:
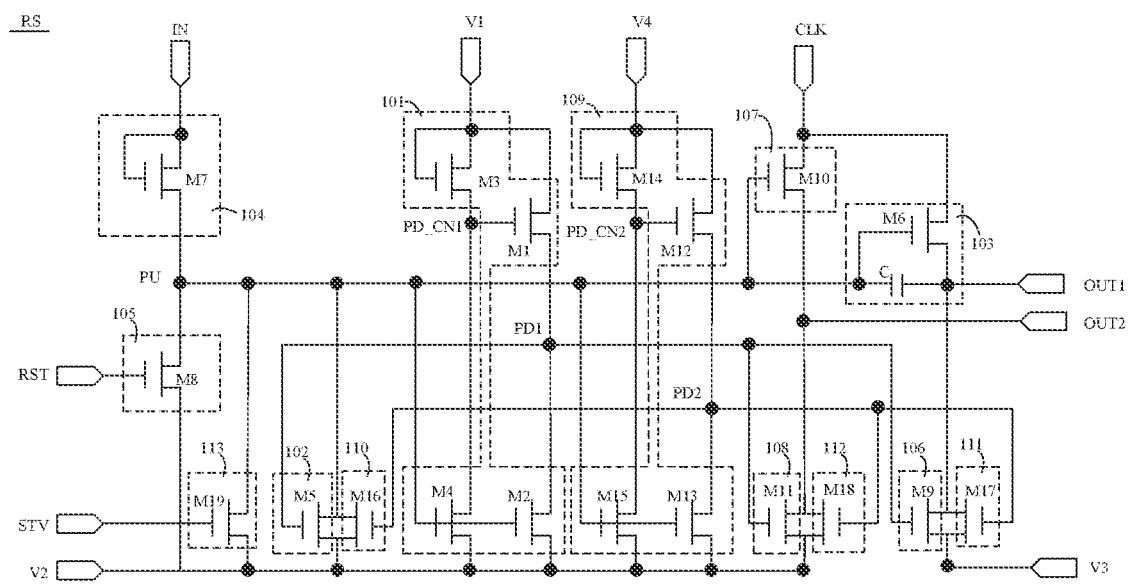
FIG. 9 is a structural diagram of yet another shift register circuit, in accordance with some embodiments.

In some embodiments, as shown in FIGS. 8 and 9, the shift register circuit RS further includes a second pull-down control sub-circuit 109 and a fifth noise reduction sub-circuit 110.

The second pull-down control sub-circuit 109 includes a twelfth transistor M12 and a thirteenth transistor M13. The twelfth transistor M12 is coupled to a fourth voltage signal terminal V4 and a second pull-down node PD2, and the thirteenth transistor M13 is coupled to the pull-up node PU, the second voltage signal terminal V2 and the second pull-down node PD2.

A width-to-length ratio of a channel of the twelfth transistor M12 is equal to the width-to-length ratio of the channel of the first transistor M1, and a width-to-length ratio of a channel of the thirteenth transistor M13 is equal to the width-to-length ratio of the channel of the second transistor M2.

The fifth noise reduction sub-circuit 110 is coupled to the second pull-down node PD2, the pull-up node PU and the second voltage signal terminal V2.

The second pull-down control sub-circuit 109 is configured to transmit, in response to a fourth voltage signal received at a fourth voltage signal terminal V4, the fourth voltage signal to the second pull-down node PD2 through the twelfth transistor M12, and transmit the second voltage signal received at the second voltage signal terminal V2 to the second pull-down node PD2 through the thirteenth transistor M13 under the control of the voltage of the pull-up node PU.

The fifth noise reduction sub-circuit 110 is configured to transmit the second voltage signal to the pull-up node PU under control of a voltage of the second pull-down node PD2.

The fourth voltage signal terminal V4 is configured to transmit the DC high-level signal (e.g., higher than or equal to the high-level portion of the clock signal) during an operation period of the second pull-down control sub-circuit 109, and the DC high-level signal is referred to herein as the fourth voltage signal.

In some embodiments, the first voltage signal and the fourth voltage signal may be mutually inverted signals. The first pull-down control sub-circuit 101 and the second pull-down control sub-circuit 109 operate alternately. In this case, the first pull-down control sub-circuit 101 or the second pull-down control sub-circuit 109 may be prevented from continuously operating, thereby shortening operation time of the first pull-down control sub-circuit 101 or the second pull-down control sub-circuit 109, and prolonging a service life of the shift register circuit RS.

It will be noted that, a cycle of alternating operation of the first pull-down control sub-circuit 101 and the second pull-down control sub-circuit 109 is not limited in the present disclosure, and may be set according to actual situations.

In some embodiments, a ratio of the width-to-length ratio of the channel of the twelfth transistor M12 to the width-to-length ratio of the channel of the thirteenth transistor M13 is equal to a ratio of the width-to-length ratio of the channel of the first transistor M1 to the width-to-length ratio of the channel of the second transistor M2.

In some embodiments, a ratio of the width-to-length ratio of the channel of the thirteenth transistor M13 to the width-to-length ratio of the channel of the twelfth transistor M12 are greater than 5:1. A driving capability of the thirteenth transistor M13 is greater than a driving capability of the twelfth transistor M12. Therefore, in a case where the pull-up node PU is charged, the second voltage signal received at the second voltage signal terminal V2 is transmitted to the second pull-down node PD2 through the thirteenth transistor M13, so that a potential of the second pull-down node PD2 may be maintained at a low-level potential. In this case, the fifth noise reduction sub-circuit 110 is not turned on, and the second voltage signal is not be transmitted to the pull-up node PU, which prevents leakage of the fifth noise reduction sub-circuit 110 from affecting the potential of the pull-up node PU, so that the pull-up node PU may be maintained at a high potential to ensure the normal output of the shift register circuit RS.

In some embodiments, as shown in FIG. 9, a control electrode of the twelfth transistor M12 is coupled to the second pull-down control node PD_CN2, a first electrode of the twelfth transistor M12 is coupled to the fourth voltage signal terminal V4, and a second electrode of the twelfth transistor M12 is coupled to the second pull-down node PD2.

A control electrode of the thirteenth transistor M13 is coupled to the pull-up node PU, a first electrode of the thirteenth transistor M13 is coupled to the second voltage signal terminal V2, and a second electrode of the thirteenth transistor M13 is coupled to the second pull-down node PD2.

In some embodiments, as shown in FIG. 9, the second pull-down control sub-circuit 109 further includes a fourteenth transistor M14 and a fifteenth transistor M15.

A control electrode and a first electrode of the fourteenth transistor M14 are coupled to the fourth voltage signal terminal V4, and a second electrode of the fourteenth transistor M14 is coupled to the second pull-down control node PD_CN2.

A control electrode of the fifteenth transistor M15 is coupled to the pull-up node PU, a first electrode of the fifteenth transistor M15 is coupled to the second voltage signal terminal V2, and a second electrode of the fifteenth transistor M15 is coupled to the second pull-down control node PD_CN2.

In some embodiments, as shown in FIG. 9, the fifth noise reduction sub-circuit 110 includes a sixteenth transistor M16.

A control electrode of the sixteenth transistor M16 is coupled to the second pull-down node PD2, a first electrode of the sixteenth transistor M16 is coupled to the second voltage signal terminal V2, and a second electrode of the sixteenth transistor M16 is coupled to the pull-up node PU.

In some embodiments, as shown in FIG. 8, in a case where the shift register circuit RS includes the first signal output sub-circuit 103, the shift register circuit RS further includes a sixth noise reduction sub-circuit 111.

The sixth noise reduction sub-circuit 111 is coupled to the second pull-down node PD2, the third voltage signal terminal V3 and the first signal output terminal OUT1.

The sixth noise reduction sub-circuit 111 is configured to transmit the third voltage signal received at the third voltage signal terminal V3 to the first signal output terminal OUT1 under the control of the voltage of the second pull-down node PD2.

In some embodiments, as shown in FIG. 8, in a case where the shift register circuit RS includes the second signal output sub-circuit 107, the shift register circuit RS further includes a seventh noise reduction sub-circuit 112.

The seventh noise reduction sub-circuit 112 is coupled to the second pull-down node PD2, the second voltage signal terminal V2 and the second signal output terminal OUT2.

The seventh noise reduction sub-circuit 112 is configured to transmit the second voltage signal received at the second voltage signal terminal V2 to the second signal output terminal OUT2 under the control of the voltage of the second pull-down node PD2.

For example, as shown in FIG. 9, the sixth noise reduction sub-circuit 111 includes a seventeenth transistor M17.

A control electrode of the seventeenth transistor M17 is coupled to the second pull-down node PD2, a first electrode of the seventeenth transistor M17 is coupled to the third voltage signal terminal V3, and a second electrode of the seventeenth transistor M17 is coupled to the first signal output terminal OUT1.

For example, as shown in FIG. 9, the seventh noise reduction sub-circuit 112 includes an eighteenth transistor M18.

A control electrode of the eighteenth transistor M18 is coupled to the second pull-down node PD2, a first electrode of the eighteenth transistor M18 is coupled to the second voltage signal terminal V2, and a second electrode of the eighteenth transistor M18 is coupled to the second signal output terminal OUT2.

In some embodiments, as shown in FIG. 8, the shift register circuit RS further includes an eighth noise reduction sub-circuit 113.

The eighth noise reduction sub-circuit 113 is coupled to an initial signal terminal STV, the pull-up node PU and the second voltage signal terminal V2.

The eighth noise reduction sub-circuit 113 is configured to transmit the second voltage signal received at the second voltage signal terminal V2 to the pull-up node PU in response to an initial signal received at the initial signal terminal STV.

For example, as shown in FIG. 9, the eighth noise reduction sub-circuit 113 includes a nineteenth transistor M19.

A control electrode of the nineteenth transistor M19 is coupled to the initial signal terminal STV, a first electrode of the nineteenth transistor M19 is coupled to the second voltage signal terminal V2, and a second electrode of the nineteenth transistor M19 is coupled to the pull-up node PU.

It will be noted that, the transistors used in the shift register RS provided by the embodiments of the present disclosure may be thin film transistors, field effect transistors or other switching devices with the same characteristics, which is not limited in the embodiments of the present disclosure.

In some embodiments, a control electrode of each transistor used in the shift register RS is a gate electrode of the transistor, a first electrode of the transistor is one of a source and a drain of the transistor, and a second electrode of the transistor is the other of the source and the drain of the transistor. Since the source and the drain of the transistor may be symmetrical in structure, there may be no difference in structure between the source and the drain of the transistor, that is, the first electrode and the second electrode of the transistor in the embodiments of the present disclosure may be the same in structure. For example, in a case where the transistor is a P-type transistor, the first electrode of the transistor is the source, and the second electrode thereof is the drain. For example, in a case where the transistor is an N-type transistor, the first electrode of the transistor is the drain, and the second electrode thereof is the source.

In the circuit provided by the embodiments of the present disclosure, the pull-up node PU, the first pull-down node PD1, the first pull-down control node PD_CN1, the second pull-down node PD2 and the second pull-down control node PD_CN2 do not denote actual components, but rather denote junctions of related electrical connections in a circuit diagram. That is, these nodes are nodes equivalent to the junctions of related electrical connections in the circuit diagram.

In the circuit provided by the embodiments of the present disclosure, specific implementation manners of the first pull-down control sub-circuit 101, the first noise reduction sub-circuit 102, the first signal output sub-circuit 103, the signal input sub-circuit 104, the second noise reduction sub-circuit 105, the third noise reduction sub-circuit 106, the second signal output sub-circuit 107, the fourth noise reduction sub-circuit 108, the second pull-down control sub-circuit 109, the fifth noise reduction sub-circuit 110, the sixth noise reduction sub-circuit 111, the seventh noise reduction sub-circuit 112 and the eighth noise reduction sub-circuit 113 are not limited to the above manners, and may be any implementation manner, such as conventional connection manners well known to a person skilled in the art, as long as corresponding functions may be ensured to be achieved. The above examples do not limit the protection scope of the present disclosure. In practical applications, a person skilled in the art may choose to use or not to use one or more of the above circuits according to situations, and various combinations and variations of the above circuits do not depart from the principle of the present disclosure, and details are not repeated herein.

Hereinafter, by taking the above transistors as N-type transistors as an example, operations of the transistors in the shift register shown in FIG. 9 in different phases (P1 to P5) of one image frame are described in detail with reference to FIG. 10.

The second voltage signal received at the second voltage signal terminal V2 and the third voltage signal received at the third voltage signal terminal V3 are both DC low-level signals.

It will be noted that, the embodiments of the present disclosure are described by taking an example in which the cycle of alternating operation of the first pull-down control sub-circuit 101 and the second pull-down control sub-circuit 109 is one image frame. On this basis, as shown in FIG. 10, in an F(j)-th image frame, the first voltage signal of the first voltage signal terminal V1 is a DC high-level signal, the fourth voltage signal of the fourth voltage signal terminal V4 is a DC low-level signal, the first pull-down control sub-circuit 101 operates, and the second pull-down control sub-circuit 109 does not operate; and in an F(+1)-th image frame, the first voltage signal of the first voltage signal terminal V1 is a DC low-level signal, the fourth voltage signal of the fourth voltage signal terminal V4 is a DC high-level signal, the first pull-down control sub-circuit 101 does not operate, and the second pull-down control sub-circuit 109 operates, where the j is a positive integer.

In a first phase (P1) of the F(j)-th image frame, referring to FIG. 8, under control of the input signal received at the signal input terminal IN, the signal input sub-circuit 104 is turned on and transmits the input signal to the pull-up node PU to charge the pull-up node PU. Under the control of the voltage of the pull-up node PU, the first output sub-circuit 103 is turned on and transmits the clock signal received at the clock signal terminal CLK to the first signal output terminal OUT1. Under the control of the voltage of the pull-up node PU, the second output sub-circuit 107 is turned on and transmits the clock signal received at the clock signal terminal CLK to the second signal output terminal OUT2.

In addition, under the control of the voltage of the pull-up node PU, the first pull-down control sub-circuit 101 transmits the second voltage signal received at the second voltage signal terminal V2 to the first pull-down node PD1.

For example, as shown in FIG. 9, under the control of the input signal with a high-level potential received at the signal input terminal IN, the seventh transistor M7 is turned on and transmits the input signal to the pull-up node PU to charge both the pull-up node PU and the storage capacitor C.

Under the control of the high-level voltage of the pull-up node PU, the sixth transistor M6 is turned on and transmits the clock signal with a low-level potential received at the clock signal terminal CLK to the first signal output terminal OUT1. Under the control of the high-level voltage of the pull-up node PU, the tenth transistor M10 is turned on and transmits the clock signal with the low-level potential received at the clock signal terminal CLK to the second signal output terminal OUT2.

In addition, the third transistor M3 is turned on under the control of the first voltage signal with a high-level potential received at the first voltage signal terminal V1, and the fourth transistor M4 is turned on under the control of the high-level voltage of the pull-up node PU. Since the width-to-length ratio of the channel of the fourth transistor M4 is greater than the width-to-length ratio of the channel of the third transistor M3, the first pull-down control node PD_CN1 is at a low-level potential, and thus the first transistor M1 is turned off. In this case, under the control of the high-level voltage of the pull-up node PU, the second transistor M2 is turned on, and the second voltage signal with a low-level voltage received at the second voltage signal terminal V2 is transmitted to the first pull-down node PD1 through the second transistor M2. Therefore, the potential of the first pull-down node PD1 may maintain the low potential of the second voltage signal. In this case, a voltage difference between the control electrode and the source electrode of the fifth transistor M5 is a negative bias voltage, and thus the fifth transistor M5 is turned off, so as to reduce leakage current of the fifth transistor M5 and prevent over-large leakage current of the fifth transistor M5 from affecting the potential of the pull-up node PU, thereby enabling the potential of the pull-up node PU maintain a high potential.

In addition, in some embodiments, in a first phase of the F(j+1)th image frame, referring to FIG. 8, the second pull-down control sub-circuit 109 transmits the second voltage signal received at the second voltage signal terminal V2 to the second pull-down node PD2 under the control of the voltage of the pull-up node PU. For example, referring to FIG. 9, the fourteenth transistor M14 is turned on under the control of the fourth voltage signal with the high-level potential received at the fourth voltage signal terminal V4, and the fifteenth transistor M15 is turned on under the control of the high-level voltage of the pull-up node PU. Since a width-to-length ratio of a channel of the fifteenth transistor M15 is greater than a width-to-length ratio of a channel of the fourteenth transistor M14, the second pull-down control node PD_CN2 is at a low-level potential, and thus the twelfth transistor M12 is turned off. In this case, under the control of the high-level voltage of the pull-up node PU, the thirteenth transistor M13 is turned on, and the second voltage signal with the low-level voltage received at the second voltage signal terminal V2 is transmitted to the second pull-down node PD2 through the thirteenth transistor M13. Therefore, the potential of the second pull-down node PD2 may maintain the low potential of the second voltage signal. In this case, a voltage difference between the control electrode and the source electrode of the sixteenth transistor M16 is a negative bias voltage, and thus the sixteenth transistor M16 is turned off, so as to reduce leakage current of the sixteenth transistor M16 and prevent overlarge leakage current of the sixteenth transistor M16 from affecting the potential of the pull-up node PU, thereby enabling the potential of the pull-up node PU maintain a high potential.

In a second phase (P2) of the F(j)-th image frame, referring to FIGS. 1, 6 and 8, in the case where the shift register circuit RS includes the first signal output sub-circuit 103, the first signal output sub-circuit 103 is turned on under the control of the voltage of the pull-up node PU, and transmits the clock signal received at the clock signal terminal CLK to the first signal output terminal OUT1. Referring to FIG. 8, in the case where the shift register circuit RS includes the first signal output sub-circuit 103 and the second signal output sub-circuit 107, the second output sub-circuit 107 is turned on simultaneously when the first signal output sub-circuit 103 is turned on under the control of the voltage of the pull-up node PU, and transmits the clock signal received at the dock signal terminal CLK to the second signal output terminal OUT2.

Figure 10:
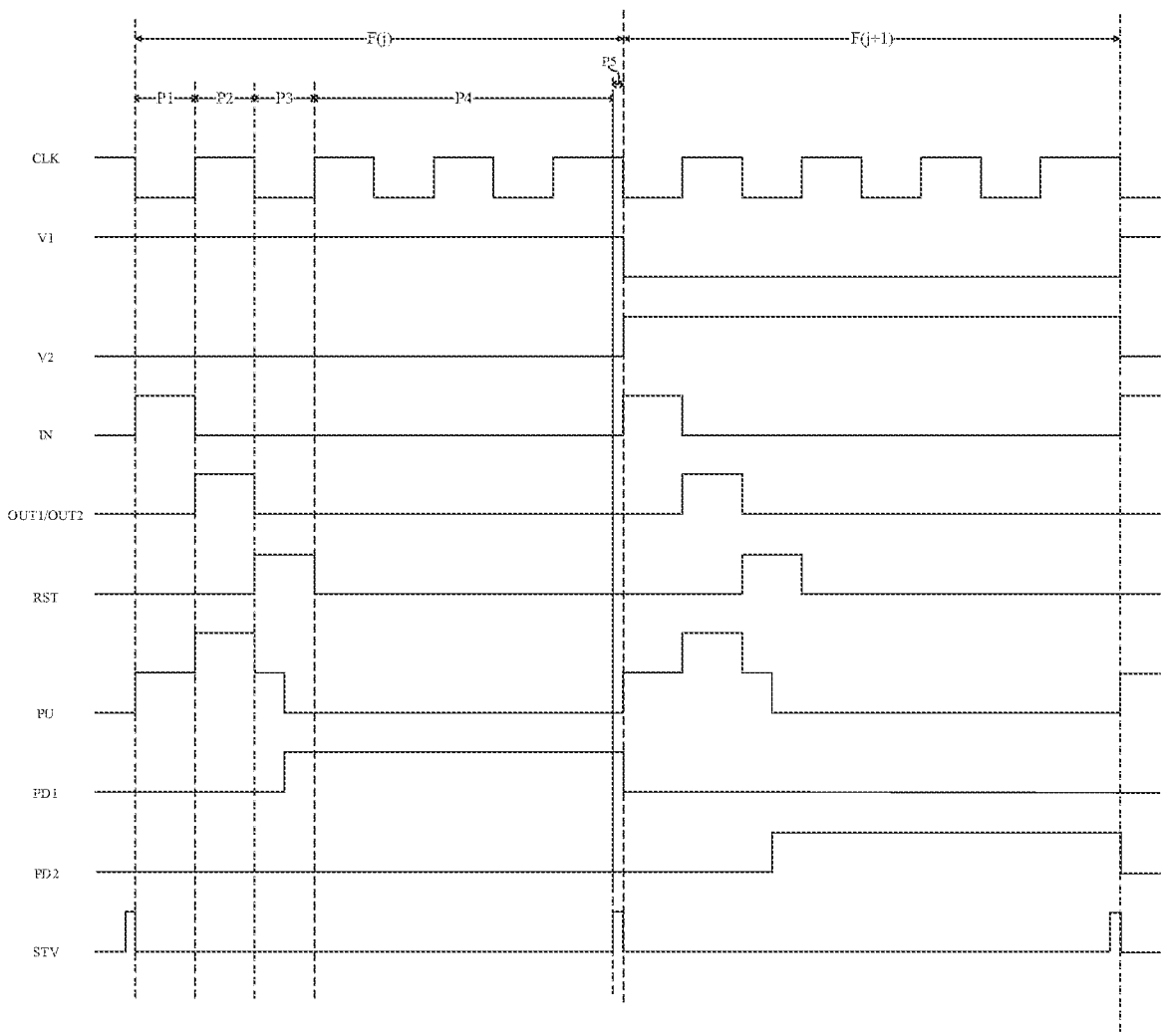
FIG. 10 is a timing control diagram of a shift register circuit, in accordance with some embodiments.

It will be noted that, since signals output by the first signal output terminal OUT1 and the second signal output terminal OUT2 are the same, the two signals are denoted by the same waveform in FIG. 10 for simplicity of explanation, but it does not mean that the two signals are a single signal.

In addition, under the control of the voltage of the pull-up node PU, the first pull-down control sub-circuit 101 transmits the second voltage signal received at the second voltage signal terminal V2 to the first pull-down node PD1.

For example, in the second phase (P2) of one image frame, as shown in FIG. 9, the storage capacitor C discharges the charges stored in the first phase (P1) to the pull-up node PU, and the sixth transistor M6 is turned on under the control of the high-level voltage of the pull-up node PU, and transmits the clock signal with a high-level potential received at the clock signal terminal CLK to the first signal output terminal OUT1. The tenth transistor M10 is turned on under the control of the high-level voltage of the pull-up node PU, and transmits the clock signal with the high-level potential received at the clock signal terminal CLK to the second signal output terminal OUT2.

It will be understood that, since a voltage difference between the first electrode and the second electrode of the storage capacitor C does not change abruptly, the storage capacitor C further raises the potential of the pull-up node PU through the coupling self-bootstrapping action in the second phase (P2).

For example, as shown in FIG. 9, the third transistor M3 is turned on under the control of the first voltage signal with the high-level potential received at the first voltage signal terminal V1, and the fourth transistor M4 and the second transistor M2 are turned on under the control of the high-level voltage of the pull-up node PU, and the first pull-down control node PD_CN1 is at a low-level potential, so that the first transistor M1 is turned off, and the second voltage signal with the low-level voltage received at the second voltage signal terminal V2 is transmitted to the first pull-down node PD1 through the second transistor M2. Therefore, the potential of the first pull-down node PD1 may maintain the low potential of the second voltage signal, so that the fifth transistor M5 is turned off to prevent overlarge leakage current of the fifth transistor M5 from affecting the potential of the pull-up node PU, thereby enabling the potential of the pull-up node PU maintain a high potential to ensure normal output of the first signal output terminal OUT1 and the second signal output terminal OUT2.

In addition, in some embodiments, in the second phase of the F(j+1)-th image frame, the second pull-down control sub-circuit 109 transmits the second voltage signal received at the second voltage signal terminal V2 to the second pull-down node PD2 under the control of the voltage of the pull-up node PU. For example, referring to FIG. 9, the fourteenth transistor M14 is turned on under the control of the fourth voltage signal with the high-level potential received at the fourth voltage signal terminal V4, and the fifteenth transistor M15 and the thirteenth transistor M13 are turned on under the control of the high-level voltage of the pull-up node PU, and the second pull-down control node PD_CN2 is at a low-level potential, so that the twelfth transistor M12 is turned off, and the second voltage signal with the low-level voltage received at the second voltage signal terminal V2 is transmitted to the second pull-down node PD2 through the thirteenth transistor M13. Therefore, the potential of the second pull-down node PD2 may maintain the low potential of the second voltage signal, so that the sixteenth transistor M16 is turned off to avoid overlarge leakage current of the sixteenth transistor M16 from affecting the potential of the pull-up node PU, thereby enabling the potential of the pull-up node PU maintain a high potential to ensure the normal output of the first signal output terminal OUT1 and the second signal output terminal OUT2.

In a third phase (P3) of the F(j)-th image frame, referring to FIG. 8, the second noise reduction sub-circuit 105 is turned on under the control of the voltage of the reset signal received at the reset signal terminal RST, and transmits the second voltage signal received at the second voltage signal terminal V2 to the pull-up node PU.

Under the control of the voltage of the pull-up node PU and the first voltage signal received at the first voltage signal terminal V1, the first voltage signal is transmitted to the first pull-down node PD1 through the first pull-down control sub-circuit 101. The first noise reduction sub-circuit 102 is turned on under the control of the voltage of the first pull-down node PD1, and transmits the second voltage signal to the pull-up node PU.

Moreover, referring to FIG. 8, in the case where the shift register circuit RS includes the first signal output sub-circuit 103, the third noise reduction sub-circuit 106 is turned on under the control of the voltage of the first pull-down node PD1, and transmits the third voltage signal received at the third voltage signal terminal V3 to the first signal output terminal OUT1. Referring to FIG. 8, in the case where the shift register circuit RS includes the first signal output sub-circuit 103 and the second signal output sub-circuit 107, the third noise reduction sub-circuit 106 and the fourth noise reduction sub-circuit 108 are turned on under the control of the voltage of the first pull-down node PD1. The third noise reduction sub-circuit 106 transmits the third voltage signal received at the third voltage signal terminal V3 to the first signal output terminal OUT1, and the fourth noise reduction sub-circuit 108 transmits the second voltage signal received at the second voltage signal terminal V2 to the second signal output terminal OUT2.

For example, in the third phase (P3), referring to FIG. 9, the eighth transistor M8 is turned on under the control of the reset signal with a high-level voltage received at the reset signal terminal RST, and transmits the second voltage signal with the low-level voltage to the pull-up node PU.

Under the control of the low-level voltage of the pull-up node PU and a high-level voltage of the first voltage signal terminal V1, the fourth transistor M4 is turned off and the third transistor M3 is turned on. The third transistor M3 transmits the high-level voltage of the first voltage signal terminal V1 to the first pull-down control node PD_CN1, so that the first transistor M1 is turned on. The second transistor M2 is turned off under control of the low-level voltage of the pull-up node PU. The first transistor M1 transmits the high-level voltage of the first voltage signal terminal V1 to the first pull-down node PD1. The fifth transistor M5 is turned on under the control of the high-level voltage of the first pull-down node PD1, and transmits the second voltage signal with the low-level voltage to the pull-up node PU.

Moreover, in some embodiments, in the case where the shift register circuit RS includes the first signal output sub-circuit 103, as shown in FIG. 9, the ninth transistor M9 is turned on under the control of the high-level voltage of the first pull-down node PD1, and transmits the third voltage signal with a low-level voltage of the third voltage signal terminal V3 to the first signal output terminal OUT1. In some embodiments, in the case where the shift register circuit RS includes the first signal output sub-circuit 103 and the second signal output sub-circuit 107, as shown in FIG. 9, the ninth transistor M9 and the eleventh transistor M11 are turned on under the control of the high-level voltage of the first pull-down node PD1. The ninth transistor M9 transmits the third voltage signal with the low level voltage of the third voltage signal terminal V3 to the first signal output terminal OUT1, and the eleventh transistor M11 transmits the second voltage signal with the low-level voltage of the second voltage signal terminal V2 to the second signal output terminal OUT2.

It will be noted that, in some embodiments, during a period after the third phase (P3) starts, the voltage of the pull-up node PU can still ensure that the first signal output sub-circuit 103 and the second signal output sub-circuit 107 are turned on. The first signal output sub-circuit 103 transmits the clock signal to the first signal output terminal OUT1 and the second signal output sub-circuit 107 transmits the clock signal to the second signal output terminal OUT2, so as to denoise the first signal output terminal OUT1 and the second signal output terminal OUT2. For example, as shown in FIG. 9, the high-level voltage signal of the pull-up node PU causes the sixth transistor M6 in the first signal output sub-circuit 103 to be turned on to transmit the clock signal with the low-level potential to the first signal output terminal OUT1, so as to denoise the first signal output terminal OUT1; the high-level voltage signal of the pull-up node PU causes the tenth transistor M10 in the second signal output sub-circuit 107 to be turned on to transmit the clock signal with the low-level potential to the second signal output terminal OUT2, so as to denoise the second signal output terminal OUT2.

In addition, in some embodiments, in a third phase of the F(+1)-th image frame, the second pull-down control sub-circuit 109 transmits the fourth voltage signal to the second pull-down node PD2 under the control of the voltage of the pull-up node PU and the fourth voltage signal received at the fourth voltage signal terminal V4. The fifth noise reduction sub-circuit 110 is turned on under the control of the voltage of the second pull-down node PD2, and transmits the second voltage signal to the pull-up node PU.

In addition, referring to FIGS. 1, 6 and 8, in the case where the shift register circuit RS includes the first signal output sub-circuit 103, the sixth noise reduction sub-circuit 111 is turned on under the control of the voltage of the second pull-down node PD2, and transmits the third voltage signal received at the third voltage signal terminal V3 to the first signal output terminal OUT1. Referring to FIG. 8, in the case where the shift register circuit RS includes the first signal output sub-circuit 103 and the second signal output sub-circuit 107, the sixth noise reduction sub-circuit 111 and the seventh noise reduction sub-circuit 112 are turned on under the control of the voltage of the second pull-down node PD2. The sixth noise reduction sub-circuit 111 transmits the third voltage signal received at the third voltage signal terminal V3 to the first signal output terminal OUT1, and the seventh noise reduction sub-circuit 112 transmits the second voltage signal received at the second voltage signal terminal V2 to the second signal output terminal OUT2.

For example, referring to FIG. 9, under the control of the low-level voltage of the pull-up node PU and the high-level voltage of the fourth voltage signal terminal V4, the fifteenth transistor M15 is turned off and the fourteenth transistor M14 is turned on, and the fourteenth transistor M14 transmits the high-level voltage of the fourth voltage signal terminal V4 to the second pull-down control node PD_CN2, so that the twelfth transistor M12 is turned on. The thirteenth transistor M13 is turned off under the control of the low-level voltage of the pull-up node PU. The twelfth transistor M12 transmits the high-level voltage of the fourth voltage signal terminal V4 to the second pull-down node PD2. The sixteenth transistor M16 is turned on under the control of the high-level voltage of the second pull-down node PD2, and transmits the second voltage signal with the low-level voltage to the pull-up node PU.

Moreover, in some embodiments, in the case where the shift register circuit RS includes the first signal output sub-circuit 103, as shown in FIG. 9, the seventeenth transistor M17 is turned on under the control of the high-level voltage of the second pull-down node PD2, and transmits the third voltage signal with a low-level voltage of the third voltage signal terminal V3 to the first signal output terminal OUT1. In some embodiments, in the case where the shift register circuit RS includes the first signal output sub-circuit 103 and the second signal output sub-circuit 107, as shown in FIG. 9, the seventeenth transistor M17 and the eighteenth transistor M18 are turned on under the control of the high-level voltage of the second pull-down node PD2. The seventeenth transistor M17 transmits the third voltage signal with the low-level voltage of the third voltage signal terminal V3 to the first signal output terminal OUT1, and the eighteenth transistor M18 transmits the second voltage signal with the low-level voltage of the second voltage signal terminal V2 to the second signal output terminal OUT2.

In a fourth phase (P4) of one image frame, referring to FIG. 8, under the control of the voltage of the pull-up node PU and the first voltage signal received at the first voltage signal terminal V1, the first voltage signal is transmitted to the first pull-down node PD1 through the first pull-down control sub-circuit 101. The first noise reduction sub-circuit 102 is turned on under the control of the voltage of the first pull-down node PD1, and transmits the second voltage signal to the pull-up node PU.

Moreover, referring to FIGS. 1, 6 and 8, in the case where the shift register circuit RS includes the first signal output sub-circuit 103, the third noise reduction sub-circuit 106 is turned on under the control of the voltage of the first pull-down node PD1, and transmits the third voltage signal received at the third voltage signal terminal V3 to the first signal output terminal OUT1. Referring to FIG. 8, in the case where the shift register circuit RS includes the first signal output sub-circuit 103 and the second signal output sub-circuit 107, the third noise reduction sub-circuit 106 and the fourth noise reduction sub-circuit 107 are turned on under the control of the voltage of the first pull-down node PD1. The third noise reduction sub-circuit 106 transmits the third voltage signal received at the third voltage signal terminal V3 to the first signal output terminal OUT1, and the fourth noise reduction sub-circuit 107 transmits the second voltage signal received at the second voltage signal terminal V2 to the second signal output terminal OUT2.

For example, in the fourth phase (P4), referring to FIG. 9, under the control of the low-level voltage of the pull-up node PU and the high-level voltage of the first voltage signal terminal V1, the fourth transistor M4 is turned off and the third transistor M3 is turned on. The third transistor M3 transmits the high-level voltage of the first voltage signal terminal V1 to the first pull-down control node PD_CN1, so that the first transistor M1 is turned on. The second transistor M2 is turned off under the control of the low-level voltage of the pull-up node PU. The first transistor M1 transmits the high-level voltage of the first voltage signal terminal V1 to the first pull-down node PD1. The fifth transistor M5 is turned on under the control of the high-level voltage of the first pull-down node PD1, and transmits the second voltage signal with the low-level voltage to the pull-up node PU.

In some embodiments, in the case where the shift register circuit RS includes the first signal output sub-circuit 103, as shown in FIG. 9, the ninth transistor M9 is turned on under the control of the high-level voltage of the first pull-down node PD1, and transmits the third voltage signal with the low-level voltage of the third voltage signal terminal V3 to the first signal output terminal OUT1. In some embodiments, in the case where the shift register circuit RS includes the first signal output sub-circuit 103 and the second signal output sub-circuit 107, as shown in FIG. 9, the ninth transistor M9 and the eleventh transistor M11 are turned on under the control of the high-level voltage of the first pull-down node PD1. The ninth transistor M9 transmits the third voltage signal with the low-level voltage of the third voltage signal terminal V3 to the first signal output terminal OUT1, and the eleventh transistor M11 transmits the second voltage signal with the low-level voltage of the second voltage signal terminal V2 to the second signal output terminal OUT2.

In addition, in some embodiments, in a fourth phase of the F(j+1)-th image frame, with reference to FIG. 8, the second pull-down control sub-circuit 109 transmits the fourth voltage signal to the second pull-down node PD2 under the control of the voltage of the pull-up node PU and the fourth voltage signal received at the fourth voltage signal terminal V4. The fifth noise reduction sub-circuit 102 is turned on under the control of the voltage of the second pull-down node PD2, and transmits the second voltage signal to the pull-up node PU.

In addition, referring to FIGS. 1, 6 and 8, in the case where the shift register circuit RS includes the first signal output sub-circuit 103, the sixth noise reduction sub-circuit 111 is turned on under the control of the voltage of the second pull-down node PD2, and transmits the third voltage signal received at the third voltage signal terminal V3 to the first signal output terminal OUT1. Referring to FIG. 8, in the case where the shift register circuit RS includes the first signal output sub-circuit 103 and the second signal output sub-circuit 107, the sixth noise reduction sub-circuit 111 and the seventh noise reduction sub-circuit 112 are turned on under the control of the voltage of the second pull-down node PD2. The sixth noise reduction sub-circuit 111 transmits the third voltage signal received at the third voltage signal terminal V3 to the first signal output terminal OUT1, and the seventh noise reduction sub-circuit 112 transmits the second voltage signal received at the second voltage signal terminal V2 to the second signal output terminal OUT2.

For example, referring to FIG. 9, under the control of the low-level voltage of the pull-up node PU and the high-level voltage of the fourth voltage signal terminal V4, the fifteenth transistor M15 is turned off and the fourteenth transistor M14 is turned on, and the fourteenth transistor M14 transmits the high-level voltage of the fourth voltage signal terminal V4 to the second pull-down control node PD_CN2, so that the twelfth transistor M12 is turned on. The thirteenth transistor M13 is turned off under the control of the low-level voltage of the pull-up node PU. The twelfth transistor M12 transmits the high-level voltage of the fourth voltage signal terminal V4 to the second pull-down node PD2. The sixteenth transistor M16 is turned on under the control of the high-level voltage of the second pull-down node PD2, and transmits the second voltage signal with the low-level voltage to the pull-up node PU.

In some embodiments, in the case where the shift register circuit RS includes the first signal output sub-circuit 103, as shown in FIG. 9, the seventeenth transistor M17 is turned on under the control of the high-level voltage of the second pull-down node PD2, and transmits the third voltage signal with the low-level voltage of the third voltage signal terminal V3 to the first signal output terminal OUT1. In some embodiments, in the case where the shift register circuit RS includes the first signal output sub-circuit 103 and the second signal output sub-circuit 107, as shown in FIG. 9, the seventeenth transistor M17 and the eighteenth transistor M18 are turned on under the control of the high-level voltage of the second pull-down node PD2. The seventeenth transistor M17 transmits the third voltage signal with the low-level voltage of the third voltage signal terminal V3 to the first signal output terminal OUT1, and the eighteenth transistor M18 transmits the second voltage signal with the low-level voltage of the second voltage signal terminal V2 to the second signal output terminal OUT2.

As shown in FIG. 10, there is a fifth phase (P5) between the end of one image frame (i.e., the F(j)-th image frame) and the beginning of a next image frame (i.e., the F(j+1)-th image frame).

In the fifth phase (P5), with reference to FIG. 8, the eighth noise reduction sub-circuit 113 in the shift register circuit RS is turned on under control of the initial signal received at the initial signal terminal STV, and transmits the second voltage signal received at the second voltage signal terminal V2 to the pull-up node PU.

For example, as shown in FIG. 9, the nineteenth transistor M19 in the shift register circuit RS is turned on under the control of the initial signal with a high-level voltage received at the initial signal terminal STV, and transmits the second voltage signal with the low-level voltage to the pull-up node PU, so as to initialize all the pull-up nodes PU in the shift register circuits RS, so that when a display apparatus enters each image frame, the pull-up nodes PU of the shift register circuits RS in a gate driving circuit 100 are all in an initialization state, thereby ensuring stable output during driving and further ensuring stability of a display image.

Figure 11:
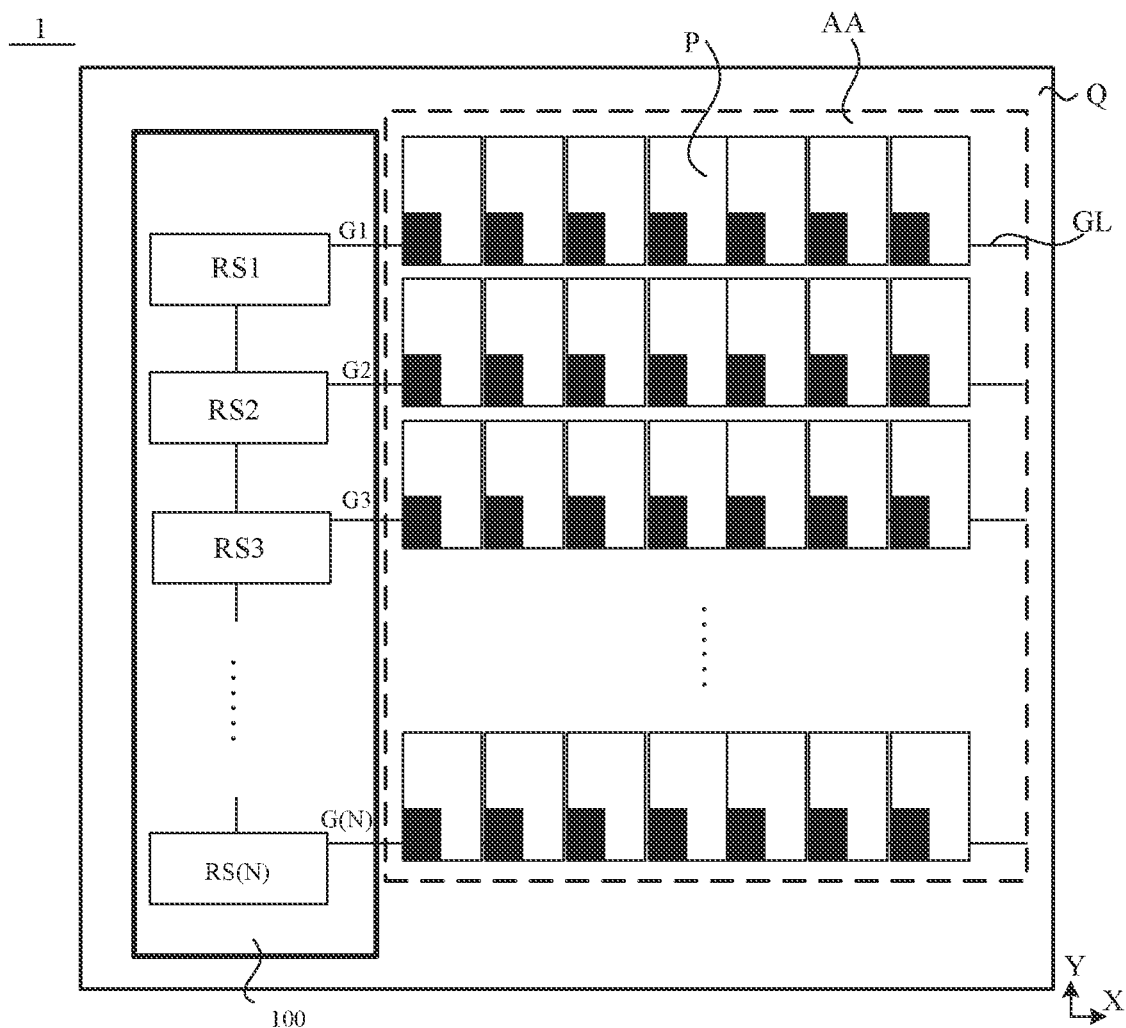
FIG. 11 is a structural diagram of a display panel, in accordance with some embodiments.

The embodiments of the present disclosure also provide an array substrate 1. As shown in FIG. 11, the array substrate 1 has a display area (also referred to as an active area AA; abbreviated as an AA area; also referred to as an effective active area) and a peripheral area Q. For example, the peripheral area Q is disposed around the display area AA.

As shown in FIG. 11, the array substrate 1 includes a plurality of sub-pixels P disposed in the display area AA. In some embodiments, the plurality of sub-pixels P include at least first color sub-pixels, second color sub-pixels and third color sub-pixels, and first color, second color and third color are three primary colors (e.g., red, green and blue).

A plurality of gate lines GL are provided in the array substrate 1, and the gate lines GL are coupled to pixel circuits in the sub-pixels P.

For example, the plurality of sub-pixels P in FIG. 11 are arranged in a matrix. In this case, sub-pixels P arranged in a line in a horizontal direction X are referred to as sub-pixels in a same row, and sub-pixels P arranged in a line in a vertical direction Y are referred to as sub-pixels in a same column. The gate lines GL extend in the horizontal direction X, and pixel circuits located in the same row are connected to the same gate line GL.

In some embodiments, as shown in FIG. 11, a gate driving circuit 100 is provided in the peripheral area Q of the array substrate 1.

The gate driving circuit 100 may be disposed in the peripheral area Q in an extending direction of the gate lines GL, and the pixel circuits in the sub-pixels P are turned on by the gate driving circuit 100 row by row.

It will be noted that, as for the gate driving circuit 100, FIG. 11 is merely a schematic diagram and is illustrated by taking single-sided driving (that is, the gate driving circuit 100 is provided at one side of the peripheral area Q of the array substrate 1, and the gate lines GL are sequentially driven row by row from one side) as an example. In some other embodiments, double-sided simultaneous driving (that is, the gate driving circuits 100 are provided at both sides of the peripheral area Q of the array substrate 1 in the extending direction of the gate lines GL, and the gate lines GL are driven row by row from both sides simultaneously by the two gate driving circuits 100) may be used. In yet some other embodiments, double-sided alternate driving (that is, the gate driving circuits 100 are provided at both sides of the peripheral area Q of the array substrate 1 in the extending direction of the gate lines GL, and the gate lines GL are driven row by row from both sides alternately by the two gate driving circuits 100) may be used in the array substrate 1.

It will be noted that, the embodiments of the present disclosure describe the gate driving circuit 100 provided in the embodiments by taking the single-sided driving as an example.

Figure 12:
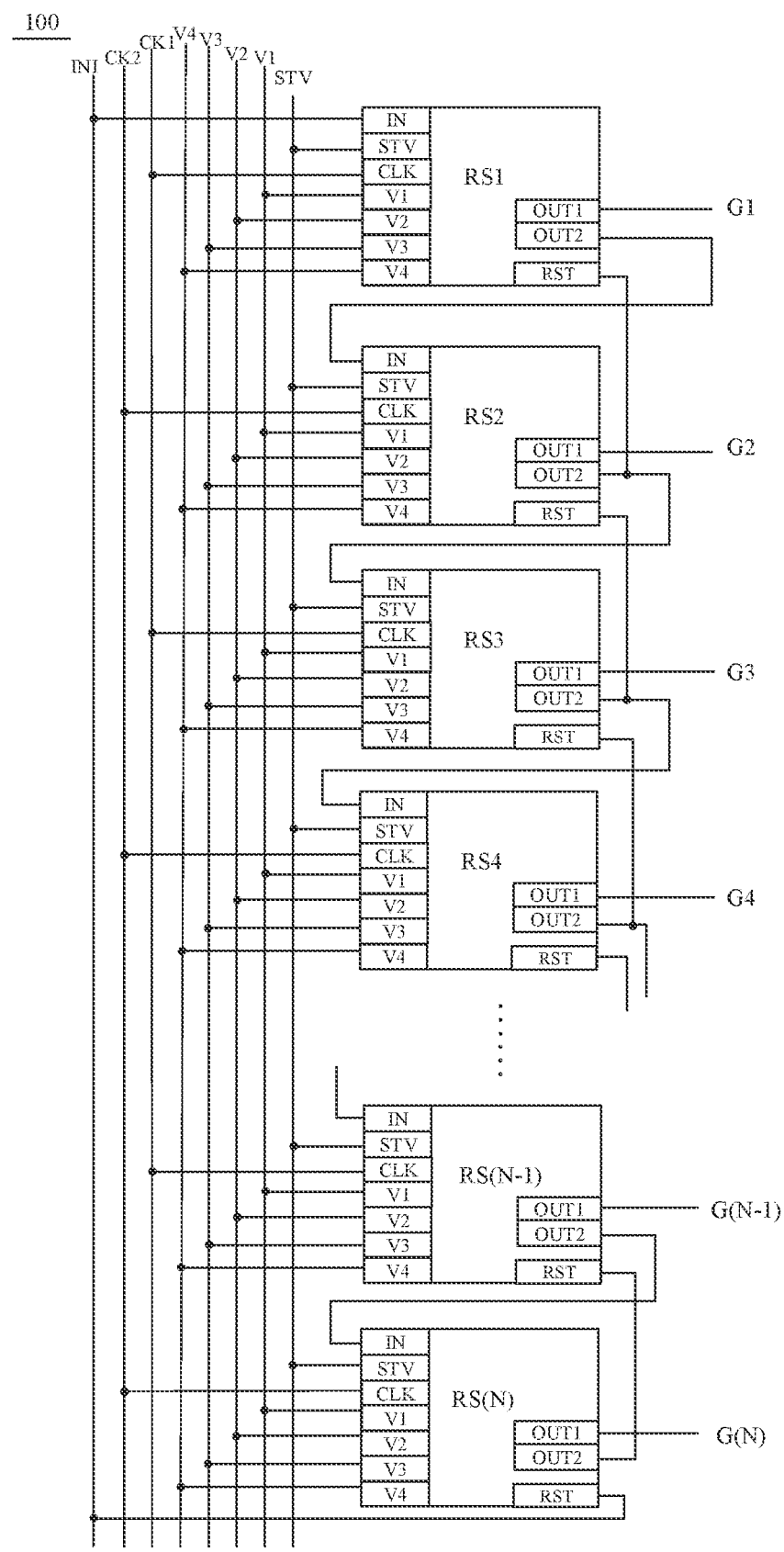
FIG. 12 is a structural diagram of a gate driving circuit, in accordance with some embodiments.

As shown in FIG. 12, in some embodiments, the gate driving circuit 100 includes a plurality of shift register circuits (RS1, RS2, . . . , RS(N−1), RS(N)) connected in cascade provided by any of the above embodiments, and the array substrate 1 includes N gate lines (G1, G2, . . . , G(N−1), G(N)) connected to the plurality of shift register circuits (RS1, RS2, . . . , RS(N−1), RS(N)) connected in cascade in a one-to-one correspondence, where N is a positive integer.

In some embodiments, in the case where the shift register circuit RS includes the first signal output sub-circuit 103 and the second signal output sub-circuit 107, the first signal output terminal OUT1 of the shift register circuit RS is coupled to the gate line. For example, as shown in FIG. 12, the first-stage shift register circuit RS1 is coupled to the gate line G1, the second-stage shift register circuit RS2 is coupled to the gate line G2, and the Nth-stage shift register circuit RS(N) is coupled to the gate line G(N). A second signal output terminal OUT2 of each shift register circuit other than the first-stage shift register circuit RS1 is coupled to a signal input terminal IN of a next-stage shift register circuit thereof. A second signal output terminal OUT2 of each shift register circuit other than a last-stage shift register circuit RS(N) is coupled to a reset signal terminal RST of a previous-stage shift register circuit thereof.

In this case, a signal output by the first signal output terminal OUT1 of the shift register circuit RS is transmitted as a gate driving signal to the gate line. A signal output by the second signal output terminal OUT2 of each shift register circuit other than the first-stage shift register circuit RS1 and the last-stage shift register circuit RS(N) is transmitted as a cascade driving signal to the signal input terminal IN of the next-stage shift register circuit and the reset signal terminal RST of the previous-stage shift register circuit.

Figure 13:
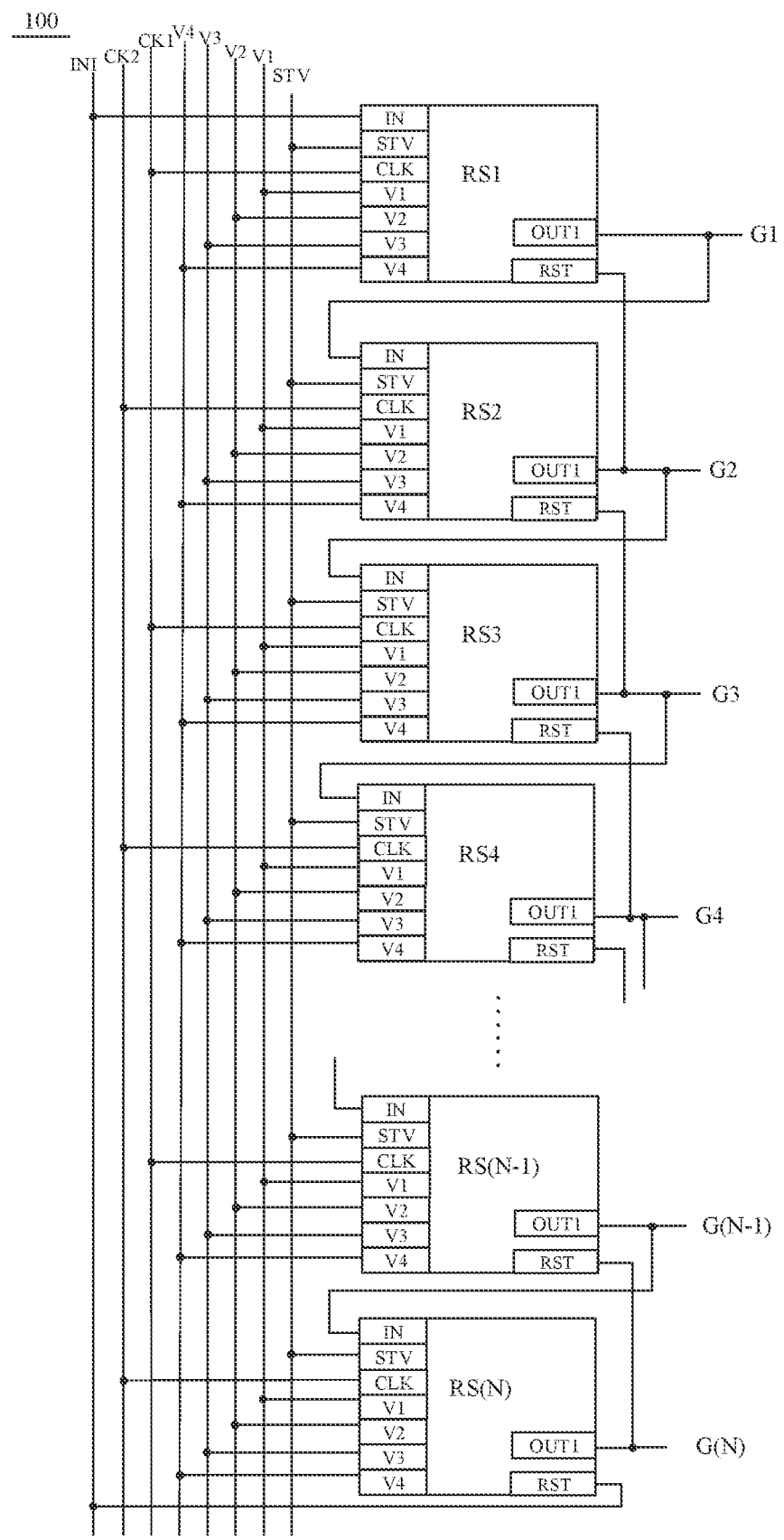
FIG. 13 is a structural diagram of another gate driving circuit, in accordance with some embodiments.

In some other embodiments, in the case where the shift register circuit RS includes the first signal output sub-circuit 103, the first signal output terminal OUT1 of the shift register circuit RS is coupled to the gate line. For example, as shown in FIG. 13, the first-stage shift register circuit RS1 is coupled to the gate line G1, the second-stage shift register circuit RS2 is coupled to the gate line G2, and the Nth-stage shift register circuit RS(N) is coupled to the gate line G(N). The first signal output terminal OUT1 of each shift register circuit other than the first-stage shift register circuit RS1 is coupled to the signal input terminal IN of the next-stage shift register circuit thereof. The first signal output terminal OUT1 of each shift register circuit other than the last-stage shift register circuit RS(N) is coupled to the reset signal terminal RST of the previous-stage shift register circuit thereof.

In this case, the signal output by the first signal output terminal OUT1 of the shift register circuit RS is transmitted as a gate driving signal to the gate line. The signal output by the first signal output terminal OUT1 of each shift register circuit other than the first-stage shift register circuit RS1 and the last-stage shift register circuit RS(N) is transmitted as a cascade driving signal to the signal input terminal IN of the next-stage shift register circuit and the reset signal terminal RST of the previous-stage shift register circuit.

In some embodiments, as show in FIG. 12, the signal input terminal IN of the first-stage shift register circuit RS1 is coupled to a start signal line INI, and the signal input terminal IN of the first-stage shift register circuit RS1 receives a start signal transmitted by the start signal line INI, so that the first-stage shift register circuit RS1 starts to operate. The reset signal terminal RST of the last-stage shift register circuit RS(N) is coupled to the start signal line INI, and the last-stage shift register circuit RS(N) is reset when the first-stage shift register circuit RS1 starts to operate. Or the reset signal terminal RST of the last-stage shift register circuit RS(N) is independently provided.

In addition, in the gate driving circuit 100, for the clock signal terminal CLK in each stage of shift register circuit, a multi-clock signal mode may be used. For example, the multi-clock signal mode may be a 2-clock signal mode, a 4-clock signal mode, a 6-clock signal mode, an 8-clock signal mode or a 10-clock signal mode, which is not limited herein.

For example, as shown in FIG. 12, the 2-clock signal mode may be used in the gate driving circuit 100. That is, two clock signal lines (CK1 and CK2) are provided in the peripheral area Q of the array substrate 1. The two clock signal lines are periodically and sequentially coupled to the clock signal terminals CLK of the shift register circuits (RS1, RS2, . . . , RS (N−1), RS(N)) connected in cascade.

In addition, the array substrate 1 is further provided with an initial signal line coupled to the initial signal terminal STV of the shift register RS, a first voltage signal line coupled to the first voltage signal terminal V1 of the shift register RS, a second voltage signal line coupled to the second voltage signal terminal V2 of the shift register RS, a third voltage signal line coupled to the third voltage signal terminal V3 of the shift register RS, and a fourth voltage signal line coupled to the fourth voltage signal terminal V4 of the shift register RS.

It will be noted that, for convenience of description, as shown in FIG. 12, the initial signal terminal and the initial signal line are both denoted by STV, but the initial signal terminal and the initial signal line are not the same component; the first voltage signal terminal and the first voltage signal line are both denoted by V1, but the first voltage signal terminal and the first voltage signal line are not the same component; the second voltage signal terminal and the second voltage signal line are both denoted by V2, but the second voltage signal terminal and the second voltage signal line are not the same component; the third voltage signal terminal and the third voltage signal line are both denoted by V3, but the third voltage signal terminal and the third voltage signal line are not the same component; and the fourth voltage signal terminal and the fourth voltage signal line are both denoted by V4, but the fourth voltage signal terminal and the fourth voltage signal line are not the same component.

The embodiments of the present disclosure also provide a display apparatus, which includes a frame, and a display panel, a circuit board and other electronic accessories that are arranged in the frame.

The display panel includes the array substrate 1, and the array substrate 1 includes the gate driving circuit 100 provided in any of the above embodiments. That is, the display apparatus includes the gate driving circuit 100 provided in any of the above embodiments.

The display apparatus described above may be any apparatus that displays images whether in motion (e.g., videos) or stationary (e.g., static images), and regardless of text or image. More specifically, it is contemplated that the embodiments may be implemented in or associated with a variety of electronic devices. The variety of electronic devices may include (but is not limit to), for example, mobile telephones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (e.g., odometer displays), navigators, cockpit controllers and/or displays, displays for camera views (e.g., displays for rear-view cameras in vehicles), electronic photos, electronic billboards or signages, projectors, architectural structures, and packaging and aesthetic structures (e.g., displays for images of a piece of jewelry).

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register circuit, comprising:
a first pull-down control sub-circuit including a first transistor and a second transistor, wherein the first transistor is coupled to a first voltage signal terminal and a first pull-down node, and the second transistor is coupled to a pull-up node, a second voltage signal terminal and the first pull-down node; a ratio of a width-to-length ratio of a channel of the second transistor to a width-to-length ratio of a channel of the first transistor is greater than 5:1; the first pull-down control sub-circuit is configured to: transmit, in response to a first voltage signal received at the first voltage signal terminal, the first voltage signal to the first pull-down node through the first transistor; and transmit a second voltage signal received at the second voltage signal terminal to the first pull-down node through the second transistor under control of a voltage of the pull-up node;
a first noise reduction sub-circuit coupled to the first pull-down node, the second voltage signal terminal and the pull-up node, the first noise reduction sub-circuit being configured to transmit the second voltage signal to the pull-up node under control of a voltage of the first pull-down node;
a second pull-down control sub-circuit including a twelfth transistor and a thirteenth transistor, wherein the twelfth transistor is coupled to a fourth voltage signal terminal and a second pull-down node, and the thirteenth transistor is coupled to the pull-up node, the second voltage signal terminal and the second pull-down node; a width-to-length ratio of a channel of the twelfth transistor is equal to the width-to-length ratio of the channel of the first transistor, and a width-to-length ratio of a channel of the thirteenth transistor is equal to the width-to-length ratio of the channel of the second transistor; the second pull-down control sub-circuit is configured to: transmit, in response to a fourth voltage signal received at the fourth voltage signal terminal, the fourth voltage signal to the second pull-down node through the twelfth transistor; and transmit the second voltage signal received at the second voltage signal terminal to the second pull-down node through the thirteenth transistor under the control of the voltage of the pull-up node; and
a fifth noise reduction sub-circuit coupled to the second pull-down node, the pull-up node and the second voltage signal terminal, the fifth noise reduction sub-circuit being configured to transmit the second voltage signal to the pull-up node under control of a voltage of the second pull-down node.

2. The shift register circuit according to claim 1, wherein the ratio of the width-to-length ratio of the channel of the second transistor to the width-to-length ratio of the channel of the first transistor is greater than or equal to 8:1.

3. The shift register circuit according to claim 1, wherein the ratio of the width-to-length ratio of the channel of the second transistor to the width-to-length ratio of the channel of the first transistor is less than or equal to 10:1.

4. The shift register circuit according to claim 1, wherein a width of the channel of the first transistor is in a range of 50 μm to 200 μm, inclusive, and a length thereof is in a range of 3 μm to 5 μm, inclusive.

5. The shift register circuit according to claim 1, wherein a width of the channel of the second transistor is in a range of 400 μm to 1500 μm, inclusive, and a length thereof is in a range of 3 μm to 5 μm, inclusive.

6. The shift register circuit according to claim 1, wherein
a control electrode of the first transistor is coupled to a first pull-down control node, a first electrode of the first transistor is coupled to the first voltage signal terminal, and a second electrode of the first transistor is coupled to the first pull-down node;
a control electrode of the second transistor is coupled to the pull-up node, a first electrode of the second transistor is coupled to the second voltage signal terminal, and a second electrode of the second transistor is coupled to the first pull-down node;
the first pull-down control sub-circuit further includes:
a third transistor, wherein a control electrode and a first electrode of the third transistor are coupled to the first voltage signal terminal, and a second electrode of the third transistor is coupled to the first pull-down control node; and
a fourth transistor, wherein a control electrode of the fourth transistor is coupled to the pull-up node, a first electrode of the fourth transistor is coupled to the second voltage signal terminal, and a second electrode of the fourth transistor is coupled to the first pull-down control node.

7. The shift register circuit according to claim 1, wherein the first noise reduction sub-circuit includes:
a fifth transistor, wherein a control electrode of the fifth transistor is coupled to the first pull-down node, a first electrode of the fifth transistor is coupled to the second voltage signal terminal, and a second electrode of the fifth transistor is coupled to the pull-up node.

8. The shift register circuit according to claim 1, further comprising:
a first signal output sub-circuit coupled to the pull-up node, a clock signal terminal and a first signal output terminal, the first signal output sub-circuit being configured to transmit a clock signal received at the clock signal terminal to the first signal output terminal under the control of the voltage of the pull-up node;
a signal input sub-circuit coupled to the pull-up node and a signal input terminal, the signal input sub-circuit being configured to transmit, in response to an input signal received at the signal input terminal, the input signal to the pull-up node;
a second noise reduction sub-circuit coupled to the pull-up node, a reset signal terminal and the second voltage signal terminal, the second noise reduction sub-circuit being configured to transmit the second voltage signal received at the second voltage signal terminal to the pull-up node in response to a reset signal received at the reset signal terminal; and
a third noise reduction sub-circuit coupled to the first pull-down node, a third voltage signal terminal and the first signal output terminal, the third noise reduction sub-circuit being configured to transmit a third voltage signal received at the third voltage signal terminal to the first signal output terminal under the control of the voltage of the first pull-down node.

9. The shift register circuit according to claim 8, wherein the first signal output sub-circuit includes:
a sixth transistor, wherein a control electrode of the sixth transistor is coupled to the pull-up node, a first electrode of the sixth transistor is coupled to the clock signal terminal, and a second electrode of the sixth transistor is coupled to the first signal output terminal; and
a storage capacitor, wherein a first electrode of the storage capacitor is coupled to the pull-up node, and a second electrode of the storage capacitor is coupled to the first signal output terminal;
the signal input sub-circuit includes:
a seventh transistor, wherein a control electrode and a first electrode of the seventh transistor are coupled to the signal input terminal, and a second electrode of the seventh transistor is coupled to the pull-up node;
the second noise reduction sub-circuit includes:
an eighth transistor, wherein a control electrode of the eighth transistor is coupled to the reset signal terminal, a first electrode of the eighth transistor is coupled to the second voltage signal terminal, and a second electrode of the eighth transistor is coupled to the pull-up node; and
the third noise reduction sub-circuit includes:
a ninth transistor, wherein a control electrode of the ninth transistor is coupled to the first pull-down node, a first electrode of the ninth transistor is coupled to the third voltage signal terminal, and a second electrode of the ninth transistor is coupled to the first signal output terminal.

10. The shift register circuit according to claim 8, further comprising:
a second signal output sub-circuit coupled to the pull-up node, the clock signal terminal and a second signal output terminal, the second signal output sub-circuit being configured to transmit the clock signal received at the clock signal terminal to the second signal output terminal under the control of the voltage of the pull-up node; and
a fourth noise reduction sub-circuit coupled to the first pull-down node, the second signal output terminal and the second voltage signal terminal, the fourth noise reduction sub-circuit being configured to transmit the second voltage signal received at the second voltage signal terminal to the second signal output terminal under the control of the voltage of the first pull-down node.

11. The shift register circuit according to claim 10, wherein
the second signal output sub-circuit includes:
a tenth transistor, wherein a control electrode of the tenth transistor is coupled to the pull-up node, a first electrode of the tenth transistor is coupled to the clock signal terminal, and a second electrode of the tenth transistor is coupled to the second signal output terminal; and the fourth noise reduction sub-circuit includes:
an eleventh transistor, wherein a control electrode of the eleventh transistor is coupled to the first pull-down node, a first electrode of the eleventh transistor is coupled to the second voltage signal terminal, and a second electrode of the eleventh transistor is coupled to the second signal output terminal.

12. A gate driving circuit, comprising a plurality of shift register circuits connected in cascade each according to claim 10;
a first signal output terminal of each shift register circuit being coupled to a gate line;
a second signal output terminal of each shift register circuit other than a first-stage shift register circuit being coupled to a signal input terminal of a next-stage shift register circuit thereof; and
the second signal output terminal of each shift register circuit other than a last-stage shift register circuit being coupled to a reset signal terminal of a previous-stage shift register circuit thereof.

13. The shift register circuit according to claim 1, wherein a control electrode of the twelfth transistor is coupled to a second pull-down control node, a first electrode of the twelfth transistor is coupled to the fourth voltage signal terminal, and a second electrode of the twelfth transistor is coupled to the second pull-down node;
a control electrode of the thirteenth transistor is coupled to the pull-up node, a first electrode of the thirteenth transistor is coupled to the second voltage signal terminal, and a second electrode of the thirteenth transistor is coupled to the second pull-down node;
the second pull-down control sub-circuit further includes:
a fourteenth transistor, wherein a control electrode and a first electrode of the fourteenth transistor are coupled to the fourth voltage signal terminal, and a second electrode of the fourteenth transistor is coupled to the second pull-down control node; and
a fifteenth transistor, wherein a control electrode of the fifteenth transistor is coupled to the pull-up node, a first electrode of the fifteenth transistor is coupled to the second voltage signal terminal, and a second electrode of the fifteenth transistor is coupled to the second pull-down control node.

14. The shift register circuit according to claim 1, wherein the fifth noise reduction sub-circuit includes:
a sixteenth transistor, wherein a control electrode of the sixteenth transistor is coupled to the second pull-down node, a first electrode of the sixteenth transistor is coupled to the second voltage signal terminal, and a second electrode of the sixteenth transistor is coupled to the pull-up node.

15. The shift register circuit according to claim 1, wherein the shift register circuit comprises:
a first signal output sub-circuit coupled to the pull-up node, a clock signal terminal and a first signal output terminal, the first signal output sub-circuit being configured to transmit a clock signal received at the clock signal terminal to the first signal output terminal under the control of the voltage of the pull-up node; and
a sixth noise reduction sub-circuit coupled to the second pull-down node, a third voltage signal terminal and the first signal output terminal, the sixth noise reduction sub-circuit being configured to transmit a third voltage signal received at the third voltage signal terminal to the first signal output terminal under the control of the voltage of the second pull-down node; and
the shift register circuit comprises:

a second signal output sub-circuit coupled to the pull-up node, the clock signal terminal and a second signal output terminal, the second signal output sub-circuit being configured to transmit the clock signal received at the clock signal terminal to the second signal output terminal under the control of the voltage of the pull-up node;
a seventh noise reduction sub-circuit coupled to the second pull-down node, the second voltage signal terminal and the second signal output terminal, the seventh noise reduction sub-circuit being configured to transmit the second voltage signal received at the second voltage signal terminal to the second signal output terminal under the control of the voltage of the second pull-down node.

16. The shift register circuit according to claim 15, wherein the sixth noise reduction sub-circuit includes:
a seventeenth transistor, wherein a control electrode of the seventeenth transistor is coupled to the second pull-down node, a first electrode of the seventeenth transistor is coupled to the third voltage signal terminal, and a second electrode of the seventeenth transistor is coupled to the first signal output terminal; and
the seventh noise reduction sub-circuit includes:
an eighteenth transistor, wherein a control electrode of the eighteenth transistor is coupled to the second pull-down node, a first electrode of the eighteenth transistor is coupled to the second voltage signal terminal, and a second electrode of the eighteenth transistor is coupled to the second signal output terminal.

17. The shift register circuit according to claim 1, further comprising:
an eighth noise reduction sub-circuit coupled to an initial signal terminal, the pull-up node and the second voltage signal terminal, the eighth noise reduction sub-circuit being configured to transmit the second voltage signal received at the second voltage signal terminal to the pull-up node in response to an initial signal received at the initial signal terminal.

18. The shift register circuit according to claim 17, wherein the eighth noise reduction sub-circuit includes:
a nineteenth transistor, wherein a control electrode of the nineteenth transistor is coupled to the initial signal terminal, a first electrode of the nineteenth transistor is coupled to the second voltage signal terminal, and a second electrode of the nineteenth transistor is coupled to the pull-up node.

19. A shift register circuit, comprising:
a first pull-down control sub-circuit including a first transistor and a second transistor, wherein the first transistor is coupled to a first voltage signal terminal and a first pull-down node, and the second transistor is coupled to a pull-up node, a second voltage signal terminal and the first pull-down node; a ratio of a width-to-length ratio of a channel of the second transistor to a width-to-length ratio of a channel of the first transistor is greater than 5:1; the first pull-down control sub-circuit is configured to: transmit, in response to a first voltage signal received at the first voltage signal terminal, the first voltage signal to the first pull-down node through the first transistor; and transmit a second voltage signal received at the second voltage signal terminal to the first pull-down node through the second transistor under control of a voltage of the pull-up node;
a first noise reduction sub-circuit coupled to the first pull-down node, the second voltage signal terminal and the pull-up node, the first noise reduction sub-circuit being configured to transmit the second voltage signal to the pull-up node under control of a voltage of the first pull-down node;

a first signal output sub-circuit coupled to the pull-up node, a clock signal terminal and a first signal output terminal, the first signal output sub-circuit being configured to transmit a clock signal received at the clock signal terminal to the first signal output terminal under the control of the voltage of the pull-up node;

a signal input sub-circuit coupled to the pull-up node and a signal input terminal, the signal input sub-circuit being configured to transmit, in response to an input signal received at the signal input terminal, the input signal to the pull-up node;

a second noise reduction sub-circuit coupled to the pull-up node, a reset signal terminal and the second voltage signal terminal, the second noise reduction sub-circuit being configured to transmit the second voltage signal received at the second voltage signal terminal to the pull-up node in response to a reset signal received at the reset signal terminal;

a third noise reduction sub-circuit coupled to the first pull-down node, a third voltage signal terminal and the first signal output terminal, the third noise reduction sub-circuit being configured to transmit a third voltage signal received at the third voltage signal terminal to the first signal output terminal under the control of the voltage of the first pull-down node;

a second signal output sub-circuit coupled to the pull-up node, the clock signal terminal and a second signal output terminal, the second signal output sub-circuit being configured to transmit the clock signal received at the clock signal terminal to the second signal output terminal under the control of the voltage of the pull-up node; and a fourth noise reduction sub-circuit coupled to the first pull-down node, the second signal output terminal and the second voltage signal terminal, the fourth noise reduction sub-circuit being configured to transmit the second voltage signal received at the second voltage signal terminal to the second signal output terminal under the control of the voltage of the first pull-down node.

20. A gate driving circuit, comprising a plurality of shift register circuits connected in cascade each according to claim 19;

a first signal output terminal of each shift register circuit being coupled to a gate line;

a second signal output terminal of each shift register circuit other than a first-stage shift register circuit being coupled to a signal input terminal of a next-stage shift register circuit thereof; and the second signal output terminal of each shift register circuit other than a last-stage shift register circuit being coupled to a reset signal terminal of a previous-stage shift register circuit thereof.

* * * * *